(12) United States Patent
Kang et al.

(10) Patent No.: US 8,680,693 B2
(45) Date of Patent: Mar. 25, 2014

(54) OLED HAVING STACKED ORGANIC LIGHT-EMITTING UNITS

(75) Inventors: Min-Soo Kang, Daejeon (KR); Jeoung-Kwen Noh, Daejeon (KR); Jung-Hyoung Lee, Daejeon (KR)

(73) Assignee: LG Chem. Ltd., Seoul (KR)

( * ) Notice: Subject to any disclaimer, the term of this patent is extended or adjusted under 35 U.S.C. 154(b) by 925 days.

(21) Appl. No.: 12/087,929

(22) PCT Filed: Jan. 17, 2007

(86) PCT No.: PCT/KR2007/000277
§ 371 (c)(1),
(2), (4) Date: Jul. 17, 2008

(87) PCT Pub. No.: WO2007/083918
PCT Pub. Date: Jul. 26, 2007

(65) Prior Publication Data
US 2009/0009101 A1  Jan. 8, 2009

(30) Foreign Application Priority Data

Jan. 18, 2006  (KR) .................. 10-2006-0005200

(51) Int. Cl.
*H01L 23/29*  (2006.01)
(52) U.S. Cl.
USPC ............. 257/790; 257/40; 257/421; 438/496
(58) Field of Classification Search
USPC .................. 438/496; 257/421, 790
See application file for complete search history.

(56) References Cited

U.S. PATENT DOCUMENTS 3,180,730 A    4/1965   Klupfel et al.
(Continued)

FOREIGN PATENT DOCUMENTS

CN        1161002 C     8/2004
(Continued)

OTHER PUBLICATIONS

G. Gu et al., "High-Efficiency, Low-Drive-Voltage, Semitransparent Stacked Organic Light-Emitting Device", Applied Physics Letters, vol. 73, No. 17, Oct. 26, 1998, pp. 2399-2401.
(Continued)

*Primary Examiner* — Kimberly Rizkallah
*Assistant Examiner* — Caleb Henry
(74) *Attorney, Agent, or Firm* — McKenna Long & Aldridge LLP

(57) ABSTRACT

The present invention provides a stacked organic light emitting device, comprising a first conductive layer, at least one intermediate conductive layer and a second conductive layer, and light emitting units disposed between the conductive layers, wherein at least two non-neighboring conductive layers among the conductive layers are conductive layers belonging to Group 1 such that they are electrically connected with each other to a common potential; at least one non-neighboring conductive layer among the conductive layers which are not electrically connected with the conductive layers belonging to Group 1 to a common potential are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

32 Claims, 12 Drawing Sheets

(56) References Cited

U.S. PATENT DOCUMENTS

| | | | |
|---|---|---|---|
| 3,567,450 A | 3/1971 | Brantly et al. | |
| 3,658,520 A | 4/1972 | Brantly et al. | |
| 4,356,429 A | 10/1982 | Tang | |
| 4,359,507 A | 11/1982 | Gaul et al. | |
| 4,720,432 A | 1/1988 | VanSlyke et al. | |
| 4,769,292 A | 9/1988 | Tang et al. | |
| 4,780,536 A | 10/1988 | Czarnik et al. | |
| 4,885,211 A | 12/1989 | Tang et al. | |
| 4,885,221 A | 12/1989 | Tsuneeda et al. | |
| 5,059,861 A | 10/1991 | Littman et al. | |
| 5,059,862 A | 10/1991 | Vanslyke et al. | |
| 5,061,569 A | 10/1991 | Vanslyke et al. | |
| 5,121,029 A | 6/1992 | Hosokawa et al. | |
| 5,141,671 A | 8/1992 | Bryan et al. | |
| 5,150,006 A | 9/1992 | VanSlyke et al. | |
| 5,151,629 A | 9/1992 | Van Slyke et al. | |
| 5,247,190 A | 9/1993 | Friend et al. | |
| 5,276,380 A | 1/1994 | Tang | |
| 5,283,182 A | 2/1994 | Powell et al. | |
| 5,294,810 A | 3/1994 | Egusa et al. | |
| 5,294,870 A | 3/1994 | Tang et al. | |
| 5,366,811 A | 11/1994 | Higashi et al. | |
| 5,405,709 A | 4/1995 | Littman et al. | |
| 5,457,565 A | 10/1995 | Namiki et al. | |
| 5,484,922 A | 1/1996 | Moore et al. | |
| 5,503,910 A | 4/1996 | Matsuura et al. | |
| 5,540,999 A | 7/1996 | Yamamoto et al. | |
| 5,593,788 A | 1/1997 | Shi et al. | |
| 5,608,287 A | 3/1997 | Hung et al. | |
| 5,616,427 A | 4/1997 | Tada | |
| 5,645,948 A | 7/1997 | Shi et al. | |
| 5,677,572 A | 10/1997 | Hung et al. | |
| 5,683,823 A | 11/1997 | Shi et al. | |
| 5,688,551 A | 11/1997 | Littman et al. | |
| 5,703,436 A * | 12/1997 | Forrest et al. | 313/506 |
| 5,714,838 A | 2/1998 | Haight et al. | |
| 5,739,545 A | 4/1998 | Guha et al. | |
| 5,755,999 A | 5/1998 | Shi et al. | |
| 5,757,139 A * | 5/1998 | Forrest et al. | 315/169.3 |
| 5,766,779 A | 6/1998 | Shi et al. | |
| 5,776,622 A | 7/1998 | Hung et al. | |
| 5,776,623 A | 7/1998 | Hung et al. | |
| 5,792,568 A | 8/1998 | Emoto et al. | |
| 5,811,833 A | 9/1998 | Thompson | |
| 5,837,391 A | 11/1998 | Utsugi | |
| 5,840,217 A | 11/1998 | Lupo et al. | |
| 5,851,709 A | 12/1998 | Grande et al. | |
| 5,917,279 A | 6/1999 | Elschner et al. | |
| 5,917,280 A * | 6/1999 | Burrows et al. | 313/506 |
| 5,927,247 A | 7/1999 | Tanaka | |
| 5,928,802 A | 7/1999 | Shi et al. | |
| 5,932,362 A | 8/1999 | Nagai et al. | |
| 5,935,720 A | 8/1999 | Chen et al. | |
| 5,935,721 A | 8/1999 | Shi et al. | |
| 5,969,474 A | 10/1999 | Arai | |
| 5,981,306 A | 11/1999 | Burrows et al. | |
| 5,982,345 A * | 11/1999 | Takayama et al. | 345/76 |
| 5,998,803 A | 12/1999 | Forrest et al. | |
| 6,020,078 A | 2/2000 | Chen et al. | |
| 6,046,543 A | 4/2000 | Bulovic et al. | |
| 6,066,357 A | 5/2000 | Tang et al. | |
| 6,097,147 A | 8/2000 | Baldo et al. | |
| 6,099,750 A | 8/2000 | Simmerer et al. | |
| 6,137,223 A | 10/2000 | Hung et al. | |
| 6,140,763 A | 10/2000 | Hung et al. | |
| 6,171,715 B1 | 1/2001 | Sato et al. | |
| 6,172,459 B1 | 1/2001 | Hung et al. | |
| 6,188,175 B1 * | 2/2001 | May et al. | 313/504 |
| 6,208,075 B1 | 3/2001 | Hung et al. | |
| 6,226,890 B1 | 5/2001 | Boroson et al. | |
| 6,237,529 B1 | 5/2001 | Spahn et al. | |
| 6,278,236 B1 | 8/2001 | Madathil et al. | |
| 6,284,393 B1 | 9/2001 | Hosokawa et al. | |
| 6,312,838 B1 | 11/2001 | Ishibashi et al. | |
| 6,320,322 B1 * | 11/2001 | Tanaka | 315/169.3 |
| 6,351,067 B2 | 2/2002 | Lee et al. | |
| 6,352,777 B1 | 3/2002 | Bulovic et al. | |
| 6,404,126 B1 | 6/2002 | Arai et al. | |
| 6,413,656 B1 | 7/2002 | Thompson et al. | |
| 6,423,429 B2 | 7/2002 | Kido et al. | |
| 6,436,559 B1 | 8/2002 | Ueno et al. | |
| 6,451,415 B1 | 9/2002 | Forrest et al. | |
| 6,451,455 B1 | 9/2002 | Thompson et al. | |
| 6,458,475 B1 | 10/2002 | Adachi et al. | |
| 6,465,115 B2 | 10/2002 | Shi et al. | |
| 6,475,648 B1 | 11/2002 | Hatwar et al. | |
| 6,497,969 B2 | 12/2002 | Kim et al. | |
| 6,501,217 B2 | 12/2002 | Beierlein et al. | |
| 6,515,298 B2 | 2/2003 | Forrest et al. | |
| 6,534,199 B1 | 3/2003 | Hosokawa et al. | |
| 6,566,806 B1 * | 5/2003 | Kawai | 313/504 |
| 6,573,651 B2 | 6/2003 | Adachi et al. | |
| 6,602,969 B2 | 8/2003 | Ueda et al. | |
| 6,627,333 B2 | 9/2003 | Hatwar | |
| 6,656,608 B1 | 12/2003 | Kita et al. | |
| 6,661,023 B2 | 12/2003 | Hoag et al. | |
| 6,696,177 B1 | 2/2004 | Hatwar | |
| 6,713,192 B2 | 3/2004 | Fukuoka et al. | |
| 6,717,358 B1 | 4/2004 | Liao et al. | |
| 6,720,092 B2 | 4/2004 | Hatwar | |
| 6,720,573 B2 | 4/2004 | Son et al. | |
| 6,765,349 B2 * | 7/2004 | Liao et al. | 313/504 |
| 6,809,472 B1 | 10/2004 | Carter et al. | |
| 6,872,472 B2 * | 3/2005 | Liao et al. | 428/690 |
| 6,875,320 B2 | 4/2005 | Raychaudhuri et al. | |
| 6,953,947 B2 | 10/2005 | Son et al. | |
| 6,963,081 B2 | 11/2005 | Gupta et al. | |
| 6,998,487 B2 | 2/2006 | Kim | |
| 6,998,789 B2 | 2/2006 | Uchida | |
| 7,052,351 B2 | 5/2006 | Tutt et al. | |
| 7,535,440 B2 * | 5/2009 | Nishi et al. | 345/76 |
| 7,538,341 B2 | 5/2009 | Son et al. | |
| 7,560,175 B2 | 7/2009 | Son et al. | |
| 7,648,779 B2 | 1/2010 | Son et al. | |
| 7,648,780 B2 | 1/2010 | Son et al. | |
| 7,763,882 B2 | 7/2010 | Noh et al. | |
| 7,830,089 B2 * | 11/2010 | Murano et al. | 313/506 |
| 8,207,665 B2 * | 6/2012 | Ibe | 313/506 |
| 2002/0011782 A1 | 1/2002 | Lee et al. | |
| 2002/0025419 A1 | 2/2002 | Lee et al. | |
| 2002/0048687 A1 | 4/2002 | Hosokawa et al. | |
| 2002/0084993 A1 * | 7/2002 | Taneya et al. | 345/204 |
| 2002/0100926 A1 | 8/2002 | Takiguchi et al. | |
| 2002/0117662 A1 | 8/2002 | Nii | |
| 2002/0117962 A1 | 8/2002 | Beierlein et al. | |
| 2002/0119297 A1 | 8/2002 | Forrest | |
| 2002/0121638 A1 | 9/2002 | Grushin et al. | |
| 2002/0127427 A1 | 9/2002 | Young et al. | |
| 2002/0158242 A1 | 10/2002 | Son et al. | |
| 2002/0186214 A1 | 12/2002 | Siwinski | |
| 2002/0197511 A1 | 12/2002 | D Andrade et al. | |
| 2003/0012890 A1 | 1/2003 | Weber et al. | |
| 2003/0017361 A1 | 1/2003 | Thompson et al. | |
| 2003/0040627 A1 | 2/2003 | Fujii | |
| 2003/0054198 A1 | 3/2003 | Tsuboyama et al. | |
| 2003/0059646 A1 | 3/2003 | Kamatani et al. | |
| 2003/0068526 A1 | 4/2003 | Kamatani et al. | |
| 2003/0068528 A1 | 4/2003 | Thompson et al. | |
| 2003/0068535 A1 | 4/2003 | Takiguchi et al. | |
| 2003/0072964 A1 | 4/2003 | Kwong et al. | |
| 2003/0072966 A1 | 4/2003 | Hosokawa et al. | |
| 2003/0124381 A1 | 7/2003 | Thompson et al. | |
| 2003/0141809 A1 | 7/2003 | Furugori et al. | |
| 2003/0151356 A1 | 8/2003 | Pichler | |
| 2003/0159729 A1 | 8/2003 | Shaheen et al. | |
| 2003/0170491 A1 * | 9/2003 | Liao et al. | 428/690 |
| 2003/0189401 A1 * | 10/2003 | Kido et al. | 313/504 |
| 2003/0197465 A1 | 10/2003 | Qiu et al. | |
| 2003/0198829 A1 | 10/2003 | Hoag et al. | |
| 2003/0203234 A1 | 10/2003 | Shi | |
| 2003/0213967 A1 | 11/2003 | Forrest et al. | |
| 2003/0218173 A1 | 11/2003 | Nishi et al. | |
| 2003/0224202 A1 | 12/2003 | Brown et al. | |
| 2004/0001969 A1 | 1/2004 | Cosimbescu et al. | |

(56) References Cited

U.S. PATENT DOCUMENTS

| | | | |
|---|---|---|---|
| 2004/0009367 A1 | 1/2004 | Hatwar | |
| 2004/0023060 A1 | 2/2004 | Kim | |
| 2004/0061439 A1 | 4/2004 | Cok | |
| 2004/0067387 A1 | 4/2004 | Kim | |
| 2004/0113547 A1 | 6/2004 | Son et al. | |
| 2004/0119400 A1* | 6/2004 | Takahashi et al. | 313/504 |
| 2004/0169175 A1 | 9/2004 | Son et al. | |
| 2004/0183067 A1* | 9/2004 | Strip | 257/40 |
| 2004/0214038 A1 | 10/2004 | Kwong et al. | |
| 2005/0012465 A1 | 1/2005 | Uchida | |
| 2005/0029933 A1* | 2/2005 | Liao et al. | 313/504 |
| 2005/0038296 A1 | 2/2005 | Hosokawa et al. | |
| 2005/0040390 A1 | 2/2005 | Pfeiffer et al. | |
| 2005/0189875 A1* | 9/2005 | Nakada | 313/504 |
| 2005/0211977 A1 | 9/2005 | Hirai et al. | |
| 2005/0212072 A1 | 9/2005 | Lee et al. | |
| 2005/0255334 A1* | 11/2005 | Kang et al. | 428/690 |
| 2005/0260442 A1 | 11/2005 | Yu et al. | |
| 2006/0038484 A1 | 2/2006 | Noh et al. | |
| 2006/0057750 A1 | 3/2006 | Aoki et al. | |
| 2006/0232992 A1* | 10/2006 | Bertram et al. | 362/555 |
| 2006/0240280 A1 | 10/2006 | Liao et al. | |
| 2006/0240281 A1 | 10/2006 | Liao et al. | |
| 2007/0102698 A1 | 5/2007 | Kang et al. | |
| 2007/0257605 A1 | 11/2007 | Son et al. | |
| 2008/0001532 A1 | 1/2008 | Son et al. | |
| 2008/0130278 A1* | 6/2008 | Ushikubo et al. | 362/231 |
| 2008/0138962 A1 | 6/2008 | Sato et al. | |
| 2008/0150846 A1* | 6/2008 | Chung | 345/80 |
| 2008/0284325 A1 | 11/2008 | Noh et al. | |
| 2009/0009101 A1 | 1/2009 | Kang et al. | |
| 2009/0058260 A9 | 3/2009 | Noh et al. | |

FOREIGN PATENT DOCUMENTS

| | | |
|---|---|---|
| EP | 0 390 551 | 10/1990 |
| EP | 0 732 868 | 9/1996 |
| EP | 0 797 375 A2 | 9/1997 |
| EP | 0 891 121 | 1/1999 |
| EP | 1 029 909 | 8/2000 |
| EP | 1 076 368 | 2/2001 |
| EP | 1 099 744 A2 | 5/2001 |
| EP | 1 179 862 A2 | 2/2002 |
| EP | 1 182 244 | 2/2002 |
| EP | 1 187 235 | 3/2002 |
| EP | 1 221 719 | 7/2002 |
| EP | 1 238 981 | 9/2002 |
| EP | 1 239 526 | 9/2002 |
| EP | 1 244 155 | 9/2002 |
| EP | 1 571 709 | 9/2005 |
| GB | 2 400 979 | 10/2004 |
| JP | 06-163158 A | 6/1994 |
| JP | 06231882 A | 8/1994 |
| JP | 07-011249 A | 1/1995 |
| JP | 07-11249 A | 1/1995 |
| JP | 07-109449 | 4/1995 |
| JP | 07-157473 | 6/1995 |
| JP | 08-167477 A | 6/1996 |
| JP | 08-180972 | 7/1996 |
| JP | 09-148071 | 6/1997 |
| JP | 2000-223276 | 8/2000 |
| JP | 2000-223276 A | 8/2000 |
| JP | 2001-110571 | 4/2001 |
| JP | 2002-246184 | 8/2002 |
| JP | 2002-246184 A | 8/2002 |
| JP | 2003-501795 | 1/2003 |
| JP | 2003-059667 | 2/2003 |
| JP | 2003-073387 | 3/2003 |
| JP | 2003-073388 | 3/2003 |
| JP | 2003-073665 | 3/2003 |
| JP | 2003146951 | 5/2003 |
| JP | 2005-167175 | 6/2003 |
| JP | 2005-167175 A | 6/2003 |
| JP | 2003-303683 A | 10/2003 |
| JP | 2004-063079 A | 2/2004 |
| JP | 2004-95850 | 3/2004 |
| JP | 2004091334 | 3/2004 |
| JP | 2004-127938 | 4/2004 |
| JP | 2005-003901 | 1/2005 |
| JP | 2005-004062 | 1/2005 |
| JP | 2005-251398 | 9/2005 |
| JP | 2007-502534 | 2/2007 |
| JP | 2007-518220 | 7/2007 |
| KR | 10-2000-0069841 A | 11/2000 |
| KR | 10-2000/0082085 | 12/2000 |
| KR | 2000-82085 | 12/2000 |
| KR | PCT/KR 00/01537 | 12/2000 |
| KR | 10-2003/0067773 | 8/2003 |
| KR | 10-2003-0067773 A | 8/2003 |
| KR | 10-2005-0029824 | 3/2005 |
| KR | PCT/KR2005/001381 | 5/2005 |
| KR | 1020010062711 | 6/2005 |
| KR | 10-2005-0103664 | 11/2005 |
| TW | 506229 | 10/2002 |
| WO | WO 98/49163 A | 11/1998 |
| WO | WO 9849163 A1 | 11/1998 |
| WO | WO 98/55561 | 12/1998 |
| WO | WO 99/39393 A1 | 8/1999 |
| WO | WO 00/18851 | 4/2000 |
| WO | WO 00/57676 | 9/2000 |
| WO | WO 00/70655 | 11/2000 |
| WO | WO 01/06576 A1 | 1/2001 |
| WO | WO 01/39234 | 5/2001 |
| WO | WO 01/41512 | 6/2001 |
| WO | WO 01/49806 A1 | 7/2001 |
| WO | WO 01/93642 | 12/2001 |
| WO | WO 02/15645 | 2/2002 |
| WO | WO 02/071813 | 9/2002 |
| WO | WO 02/074015 | 9/2002 |
| WO | WO 03/012890 A2 | 2/2003 |
| WO | WO 03/060956 A2 | 7/2003 |
| WO | WO 03/083958 A2 | 10/2003 |
| WO | WO 2004/018587 | 3/2004 |
| WO | WO 2004/054326 | 6/2004 |
| WO | WO 2005/015640 | 2/2005 |
| WO | WO 2005/109542 | 11/2005 |
| WO | WO 2006/008829 | 1/2006 |
| WO | WO 2006/019270 A1 | 2/2006 |
| WO | WO 2007/011132 | 1/2007 |

OTHER PUBLICATIONS

G. Gu et al., "A Metal-Free, Full-Color Stacked Organic Light-Emitting Device", Applied Physics Letters, vol. 74, No. 2, Jan. 11, 1999, pp. 305-307.

Zilan Shen et al., "Three-Color, Tunable, Organic Light-Emitting Devices", Science AAAS, vol. 276, Jun. 27, 1997, pp. cover, 2009-2011.

Birnstock et al., "Screen-printed passive matrix displays based on light-emitting polymers", Applied Physics Letters, vol. 78, (24), pp. 3905-3907 (Jun. 2001).

Chang et al., "Dual-color polymer light-emitting pixels processed by hybrid inkjet printing", Applied Physics Letters, 73 (18), pp. 2561-2563 (Nov. 1998).

Chieh-Wei Chen, et al. "An Effective Cathode Structure for Inverted Top-Emitting Organic Light-Emitting Devices", Applied Physics Letters, vol. 85 (13), pp. 2469-2471 (Sep. 2004).

Cui et al., "Indium Tin Oxide Alternatives—High Work Function Transparent Conducting Oxides as Anodes for Organic Light-Emitting Diodes", pp. 1476-1480, Advanced Materials, 2001, 13, No. 19, (Oct. 2001).

Gu, et al., "Transparent Organic Light Emitting Devices", Applied Physics Letters, vol. 68 (19), p. 2606-2608 (May 1996).

Hung, et al. "Interface Engineering in Preparation of Organic Surface-Emitting Diodes", Applied Physics Letters, vol. 74 (21), pp. 3209-3211 (May 1999).

Jie Liu, et al. "Efficient Bottom Cathodes for Organic Light-Emitting Devices", Applied Physics Letters, vol. 85 (5), pp. 837-839 (Aug. 2004).

(56) References Cited

OTHER PUBLICATIONS

Kim, J.S. et al., "Indium-tin oxide treatmenst for single-and double-layer polymeric light-emitting diodes: The relation between the anode physical, chemical, and morphological properties and the device performance", Journ. of Applied Physics, vol. 84, No. 12, pp. 6859-6870 (Dec. 1998).

Kruger, Jessica et al., "Modification of $TiO_2$ Heterojunctions with Benzoic Acid Derivatives in Hybrid Molecular Solid-State Devices," Advanced Materials, vol. 12, pp. 447-451 (2000).

Parthasarathy, et al. "A Metal-Free Cathode for Organic Semiconductor Devices" Applied Physics Letters, vol. 72, (17), pp. 2138-2140 (Apr. 1998).

Perterse, Koen et al., "Towards Organic N-Type Semi-Conducting Materials", Polymer preprint, 40, pp. 404-405 (1999).

Gu et al., "Transparent organic light emitting devices," Applied Physics letters, vol. 68, No. 19, May 6, 1996, American Institute of Physics, 1996, 3 pages.

Parthasarathy et al., "A metal-free cathode for organic semiconductor devices," Applied Physics Letters vol. 72, No. 17, Apr. 27, 1998, American Institute of Physics, 1999, 3 pages.

Hung et al., "Interface engineering in preparation of organic surface-emitting diodes," Applied Physics Letters, vol. 74, No. 21, May 24, 1999, American Institute of Physics, 1999, 3 pages.

Liu et al., "Efficient bottom cathodes for organic light-emitting devices," Applied Physics Letters, vol. 85, No. 5, Aug. 2, 2004, American Institute of Physics, 2004, 3 pages.

Chen et al., "An effective cathode structure for inverted top-emitting organic light-emitting devices," Applied Physics Letters, vol. 85, No. 13, Sep. 27, 2004, American Institute of Physics, 2004, 3 pages.

Adachi et al, Electroluminescence in Organic Films with Three-Layer Structure, Japanese Journal of App. Physics, 27, L269 (1988).

Tang et al, Electroluminescence of Doped Organic Thin Films, Jour. of Appl. Phys. 65, 3610 (1989).

Mason et al, Characterization of treated indium-tin-oxide surfaces used in electroluminescent devices, Jour. Appl. Phys. 86(3) 1688 (1999).

Zhou et al. "Low-voltage inverted transparent vacuum deposited organic light-emitting diodes using electrical doping", Applied Physics Letters, vol. 81, No. 5, Jul. 29, 2002, p. 992-924.

\* cited by examiner

OLED HAVING STACKED ORGANIC LIGHT-EMITTING UNITS

TECHNICAL FIELD

The present invention relates to a stacked organic light emitting device (OLED). This application claims priority to International Application No. PCT/KR2007/000277, filed on Jan. 17, 2007, and Korean Patent Application No. 10-2006-0005200, filed on Jan. 18, 2006, which are hereby incorporated by reference in their entirety.

BACKGROUND ART

An organic light emitting device usually comprises two electrodes, and an organic material layer interposed therebetween. The organic light emitting device can further comprise an electron- or hole-injecting layer, or an electron- or hole-transporting layer to improve the performances.

Recently, a stacked organic light emitting device which can enhance the light emitting efficiency per unit area by interposing an organic light emitting layer in the pixel regions of the organic light emitting device has been developed.

FIG. 1 illustrates a cross-section of the conventional stacked organic light emitting device. The device shown in FIG. 1 has a stacked structure in which an anode electrode, a light emitting layer and a cathode electrode are typically sequentially repeated. In the stacked organic light emitting device having such the structure, a predetermined voltage is applied between the uppermost cathode electrode and the lowermost anode electrode. Because of the voltage applied between the two electrodes, a vertical current path is formed depending on the applied voltage. Since light is emitted from several light emitting layers, that is, a first light emitting layer and a second light emitting layer, the luminous efficiency per unit area is enhanced compared to the conventional organic light emitting device having a single emission layer.

Forrest et al. suggested a SOLED (Stacked OLED) using an ITO which is a transparent electrode having a high transmittance for effectively transmitting a visible ray from the inside to the outside of the stacked device, as an intermediate conductive layer which is interposed between the light emitting units and acts as an anode electrode and a cathode electrode. ["Three-Color, Tunable, Organic Light Emitting Devices", S. R. Forrest et al, Science, vol. 276, 1997, p 2009, "A metal-free, full-color stacked organic light emitting device", S. R. Forrest et al, Applied Physics Letters, Vol. 74, 1999, 305.].

However, the conductive oxide film such as IZO (indium zinc-oxide) and ITO (indium tin-oxide), as a transparent electrode which is usually used as an anode, has a high work function (usually >4.5 eV). Consequently, when it is used to form a cathode electrode, it is not easy to inject electrons from the cathode to the light emitting layer. From this, there occur some problems that the operational voltage of the organic light emitting device is greatly increased, and that critical characteristics as the device such as light emitting efficiency is deteriorated. Accordingly, it has some limitation on the use of the transparent electrode, which is used as an anode electrode, as a common electrode acting as both of an anode electrode and a cathode electrode.

Meanwhile, U.S. Pat. No. 5,917,280 describes a SOLED, wherein a Mg:Ag alloy layer which is a semi-transparent electrode is used as an intermediate conductive layer which is interposed between the light emitting units, and acts as a common electrode, that is, an electrode acting as both of an anode and a cathode.

Generally, in order to accelerate the hole injection, a material having HOMO energy level such that the anode electrode is modulated to have a Fermi energy level similar to the HOMO (highest occupied molecular orbital) energy level of the hole injecting layer, or having a HOMO energy level similar to the Fermi energy level of the anode electrode is selected as a hole injecting layer. However, since the hole injecting layer should be selected taking into consideration not only the Fermi energy level of the anode electrode, but also the HOMO energy level of the hole transporting layer or the light emitting layer, there is some limitation on selection of the materials for the hole injecting layer. Accordingly, even in the case of using the materials used for a cathode such as a Mg:Ag alloy layer as a common electrode, light emitting characteristics are inevitably limited.

In order to overcome the above-described problems, Forrest et al. has suggested a SOLED having a structure as shown in FIG. 2, in which a Mg:Ag alloy layer and ITO are sequentially stacked for an intermediate conductive layer ["High-efficiency, low-drive-voltage, semitransparent stacked organic light emitting device" S. R. Forrest et al., Applied Physics Letters, vol. 73, 1998, p 2399.]. This SOLED allows color temperature calibration of each unit of the light emitting layers, but color temperature control needs a very complicated electrode structure. Further, this SOLED has a drawback that the preparation process is complicated, for example, due to formation of a Mg:Ag/ITO double layer having limited transparency.

Korean Patent Application Publication No. 2005-29824 discloses a stacked organic light emitting device wherein each of the light emitting units stacked as shown in FIG. 3 is linked in the independent current path. However, in such the stacked organic light emitting device, two light emitting units on the right side and the left side of the intermediate conductive layer (220) are formed in an inverting structure and a non-inverting structure, and accordingly, it is substantially only configured to make the same currents to be applied to a unit device simultaneously, which does not allow color temperature calibration.

Meanwhile, the present inventors filed patent applications on an organic light emitting device, comprising an anode containing a conductive layer and an n-type organic material layer positioned on the conductive layer; a cathode; and a p-type organic material layer, which is positioned between the conductive layer of the anode and the cathode, and is joined with the n-type organic material layer to form an NP junction, wherein an electrical barrier against hole injection and/or hole discharge in the anode/organic material layer interface is lowered by controlling the difference between the LUMO energy level of the n-type organic material layer in the anode and the Fermi energy level of the conductive layer in the anode. Therefrom, the hole injection and/or hole discharge performance is improved, thus giving a high device performance, and an electrode formed of various materials, which favorably make the process for preparing the device easier (see, PCT/KR2005/001381 and Korean Patent Application No. 2005-103664). Particularly, the organic light emitting device according to Korean Patent Application No. 2005-103664 has an advantage that Ca, Ca:Ag, Ca-IZO or Mg:Ag materials can be used for the conductive layer of an anode electrode, and the same materials can be used for the anode electrode and the cathode electrode.

DISCLOSURE OF INVENTION

Technical Problem

It is an object of the present invention to provide a stacked organic light emitting device which is capable of color temperature control through the partial color control by individually operating each of the stacked light emitting units. It is another object of the present invention to provide a stacked organic light emitting device which is capable of establishing various display devices by operating the stacked light emitting units alternately and controlling the operation time and intensity of each light emitting unit. Further, it is still another object of the present invention to provide a stacked organic light emitting device, wherein an intermediate conductive layer for a common electrode can be the same materials as the anode electrode or the cathode electrode.

Technical Solution

In order to solve the above-described objects, the present invention provides a stacked organic light emitting device, comprising a first conductive layer, at least one intermediate conductive layer and a second conductive layer, and light emitting units disposed between the conductive layers, wherein at least two non-neighboring conductive layers among the conductive layers are conductive layers belonging to Group 1 such that they are electrically connected with each other to a common potential; at least one non-neighboring conductive layer among the conductive layers which are not electrically connected with the conductive layers belonging to Group 1 to a common potential are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

In the stacked organic light emitting device having such structure, each of the stacked light emitting units individually performs the operation and the non-operation alternately according to the a positive voltage and a negative voltages applied to the conductive layers adjacent thereto. Thus, in the stacked organic light emitting device according to the present invention, color temperature control can be effected by individual operation of each of the light emitting units. Further, in the stacked organic light emitting device according to the present invention, by controlling the time or voltage intensity for alternately applying the positive voltages and negative voltages to the conductive layers, displaying more various kinds of colors can be established. In the stacked organic light emitting device according to the present invention, at least one of the light emitting units comprises an n-type organic material layer adjacent to any one of the conductive layers, and a p-type organic material layer to form an NP junction with the n-type organic material layer, and their energy levels satisfy the following equations:

$$E_{nL} - E_F \leq 4 \text{ eV} \tag{1}$$

$$E_{pH} - E_{nL} \leq 1 \text{ eV} \tag{2}$$

In the above equations (1) and (2), $E_F$ is a Fermi energy level of the conductive layer adjacent to the n-type organic material layer, $E_{nL}$ is a LUMO (lowest unoccupied molecular orbital) energy level of the type organic material layer, and $E_{pH}$ is HOMO (highest occupied molecular orbital) energy level of the p-type organic material layer.

Advantageous Effects

It is an advantage of the stacked organic light emitting device according to the present invention that it is capable of color temperature control through the partial color control by individually operating each of the stacked light emitting units, and it is capable of establishment of various display devices by alternately operating the stacked light emitting units. Since the organic light emitting device according to the present invention comprises an n-type organic material layer and a p-type organic material layer, wherein a combination thereof lowers the electrical barrier against hole injection and hole discharge, and forms an NP junction, it provides a high device efficiency and availability of various materials for the electrode materials, thus it giving an effect of simplifying the preparation process for the device.

NUMERAL REFERENCES

Figure 1:
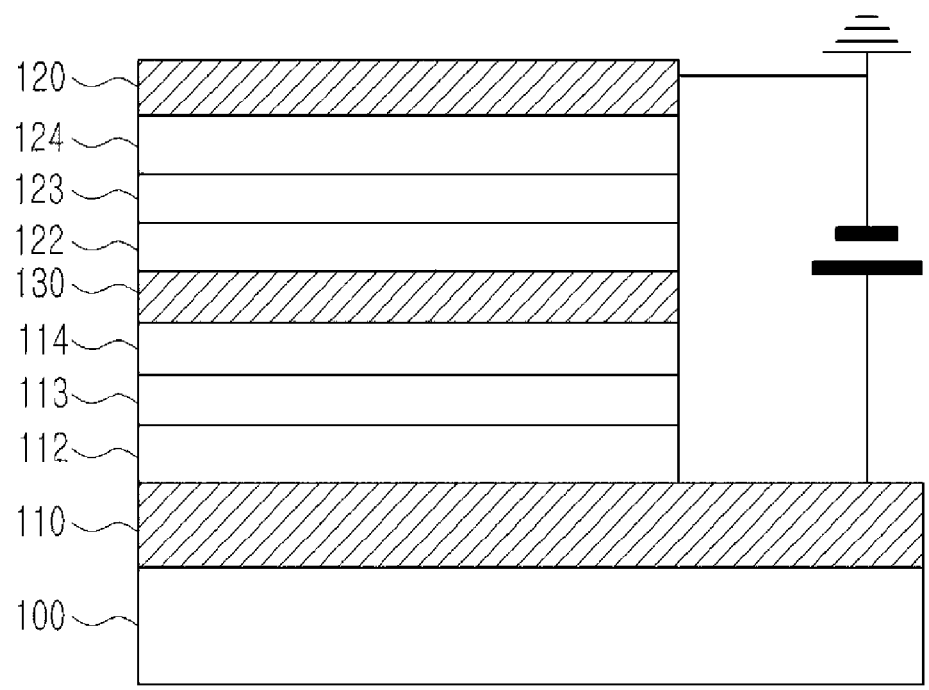
FIGS. 1, 2 and 3 are cross-sectional structure diagrams illustrating the conventional stacked organic light emitting devices.
Figure 2:
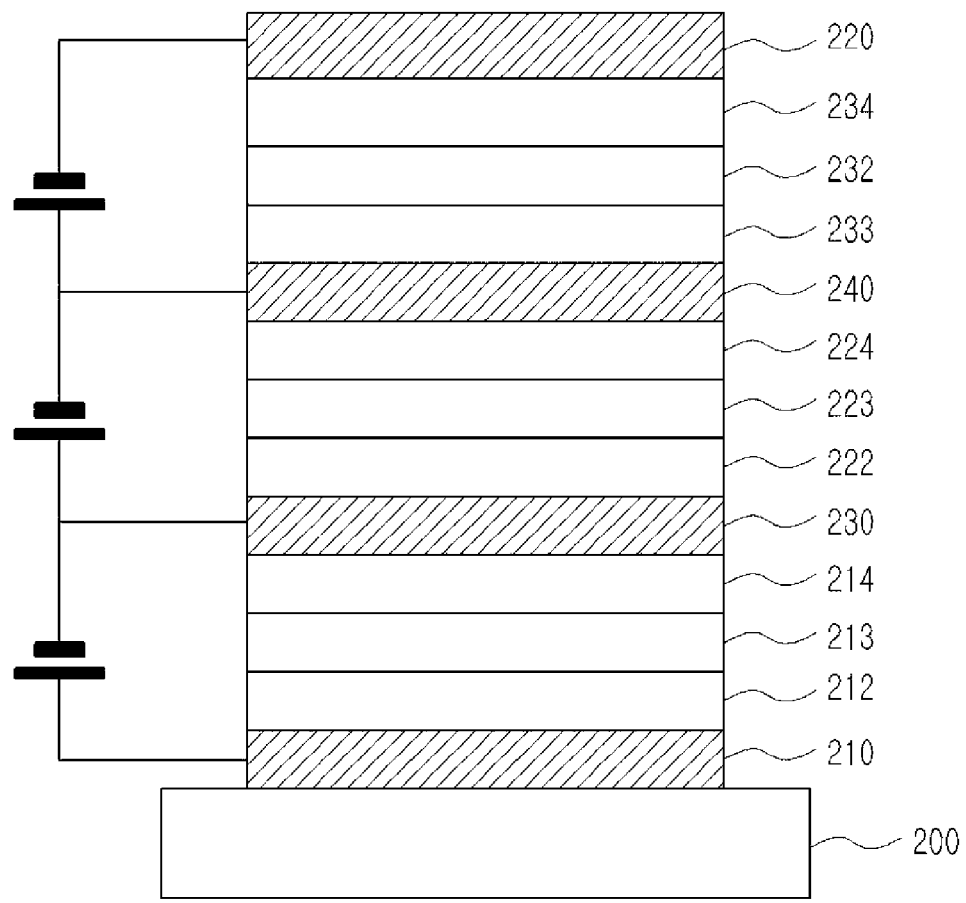
Figure 3:
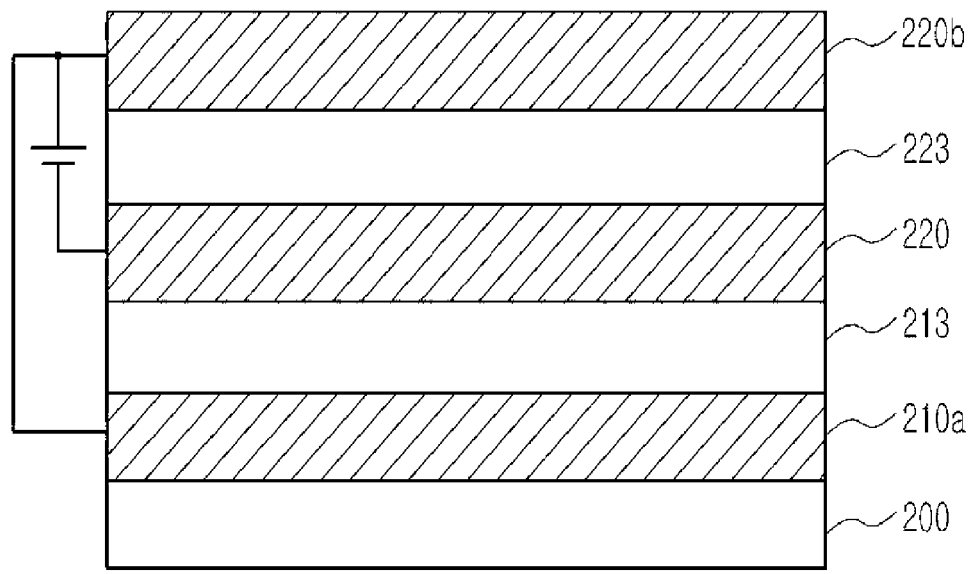

100, 200, 300, 400, 500, 600, 700, 800: Substrate
110, 210, 210a, 210b, 310, 410, 510, 610, 710, 810: First conductive layer
120, 220, 320, 420, 520, 620, 720, 820: Second conductive layer
311, 321, 411, 421, 431, 511, 621, 531, 611, 621, 631, 641, 711, 721, 731, 741, 811, 821, 831, 841: N-type organic material layer
112, 122, 212, 222, 232, 312, 322, 412, 422, 432, 512, 522, 532, 612, 622, 632, 642, 712, 722, 732, 742, 812, 822, 832, 842: Hole transporting layer
113, 123, 213, 223, 233, 313, 323, 413, 423, 433, 513, 523, 533, 613, 623, 633, 643, 713, 723, 733, 743, 813, 823, 833, 843: Light emitting layer
114, 124, 214, 224, 234, 314, 324, 414, 424, 434, 514, 524, 534, 614, 624, 634, 644, 714, 724, 734, 744, 814, 824, 834, 844: Electron transporting layer
130, 230, 240, 330, 430, 440, 530, 540, 630, 640, 650, 730, 740, 750, 830, 840, 850: Intermediate conductive layer
350, 450, 550, 650, 750, 850: Pulse generator

BEST MODE FOR CARRYING OUT THE INVENTION

Hereinbelow, preferable embodiments of the present invention will be described in detail with reference to the figures. However, the below-described accompanying figures and detailed description will be provided for the purpose of illustrating the present invention in nature, and thus, the scope of the present invention is not limited thereto. Various modifications of the following preferable embodiments will be made within the scope of the present invention.

The stacked organic light emitting device according to the present invention is characterized in that at least two non-neighboring conductive layers among the conductive layers are conductive layers belonging to Group 1 such that they are electrically connected with each other to a common potential; at least one non-neighboring conductive layer among the conductive layers which are not electrically connected with the conductive layers belonging to Group 1 to a common potential are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

Figure 6:
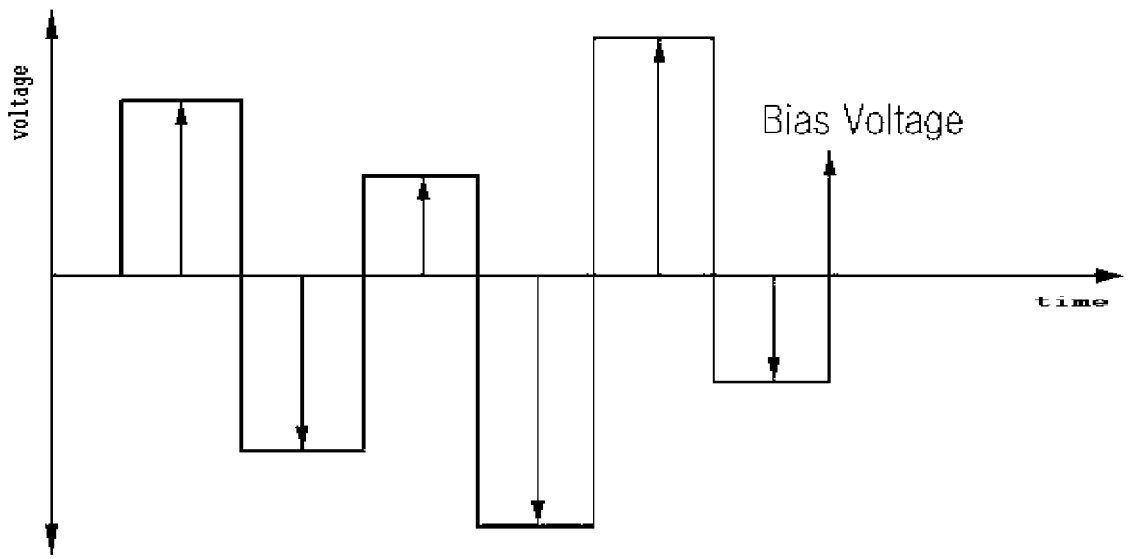
FIG. 6 illustrates the embodiment for controlling the height of the pulse of the pulse voltage applied to the intermediate conductive layer.
Figure 7:
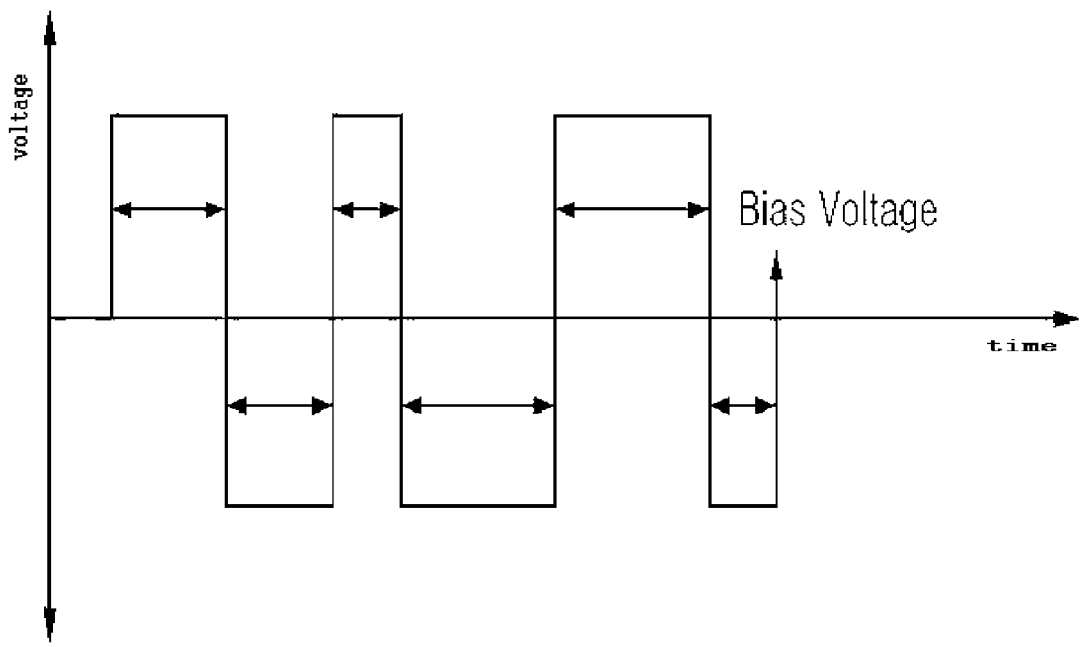
FIG. 7 illustrates the embodiment for controlling the width of the pulse of the pulse voltage applied to the intermediate conductive layer.

At this time, the voltage regulator is not particularly limited to a specific species as long as it plays a role in achieving its purpose, but it can apply positive voltages and negative voltages alternately, for examples, through a sine wave alternating current voltage, a direct current voltage, or a pulse voltage. The voltage regulator may be further provided with a means of controlling the time or voltage intensity for alternately applying the positive voltages and negative voltages, such as a means of modulating the width or height of the sine wave or the pulse. By controlling the time or voltage intensity for alternately applying the positive voltages and negative voltages to each of the conductive layers, the stacked organic light emitting device according to the present invention can be used to establish various display. FIG. 6 shows an example for modulation of the height of the pulse, and FIG. 7 shows an example for modulation of the width of the pulse.

The present invention can provide various embodiments with modifications in the numbers of the intermediate conductive layers and the light emitting units, and the electrical connection states of the conductive layers, within the scope satisfying the above-described conditions.

According to one embodiment of the present invention, there is provided a stacked organic light emitting device, comprising a first conductive layer, at least one intermediate conductive layer and a second conductive layer, and light emitting units disposed between the conductive layers, wherein the first conductive layer and at least one intermediate conductive layer are conductive layers belonging to Group 1 such that they are electrically connected with each other to a common potential; the second conductive layer, and at least one intermediate conductive layer not belonging to Group 1 are conductive layers belonging to Group 2 such that they are electrically connected with each other to a common potential; the conductive layers belonging to Group 1 are not neighboring to each other, the conductive layers belonging to Group 2 are not neighboring to each other, and the conductive layers belonging to Group 1 and the conductive layers belonging to Group 2 are connected with each other via a voltage regulator for alternately applying a positive voltage and a negative voltage.

According to another embodiment of the present invention, there is provided a stacked organic light emitting device, comprising a first conductive layer, at least one intermediate conductive layer and a second conductive layer, and light emitting units disposed between the conductive layers, wherein the first conductive layer and the second conductive layer are conductive layers belonging to Group 1 such that they are electrically connected with each other to a common potential; at least one conductive layer among the intermediate conductive layers which are not neighboring to each other are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

According to still another embodiment of the present invention, there is provided a stacked organic light emitting device, comprising a first conductive layer, at least one intermediate conductive layer and a second conductive layer, and light emitting units disposed between the conductive layers, wherein the first conductive layer, the second conductive layer, and at least one intermediate conductive layer which is not adjacent to the first or second conductive layers are conductive layers belonging to Group 1 such that they are electrically connected with each other to a common potential; at least one non-neighboring conductive layer among the conductive layers which are not electrically connected with the conductive layers belonging to Group 1 to a common potential are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

Figure 4:
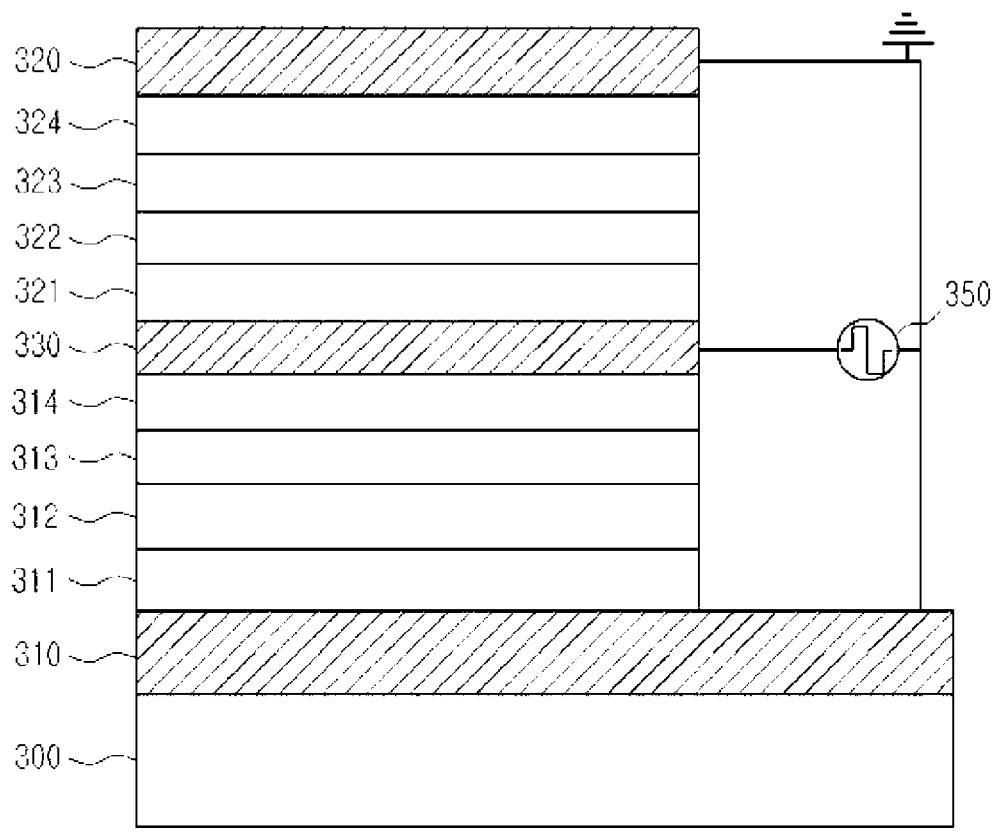
FIGS. 4 and 5 are a schematic cross-sectional diagram illustrating the stacked organic light emitting device comprising one intermediate conductive layer and a pulse generator, according to one embodiment of the present invention, and a schematic diagram of the equivalent circuit in the structure, respectively.
Figure 5:
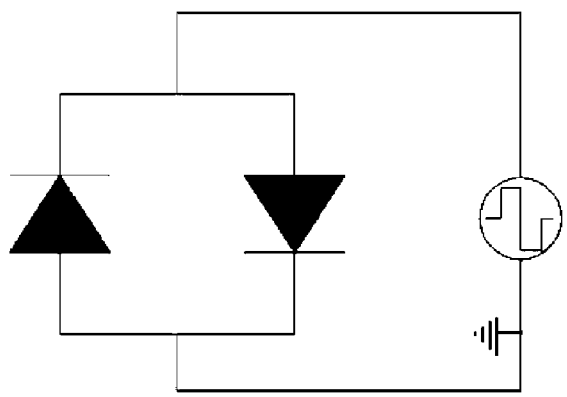

According to still another embodiment of the present invention, there is provided a stacked organic light emitting device, comprising a first conductive layer, a first light emitting unit, an intermediate conductive layer, a second light emitting unit, and a second conductive layer, wherein the first conductive layer and the second conductive layer are conductive layers belonging to Group 1 such that they are electrically connected with each other to a common potential; and the intermediate conductive layer and the conductive layers belonging to Group 1 are connected with each other via a voltage regulator for alternately applying a positive voltage and a negative voltage. This embodiment relates to an organic light emitting device comprising bilayered light emitting units, and its structure is illustrated in FIG. 4. FIG. 5 shows a schematic diagram of the equivalent circuit in the structure of the organic light emitting device comprising the bilayered light emitting units.

The stacked organic light emitting device as show in FIG. 4 comprises a substrate (300); a first conductive layer (310) positioned on the substrate (300); a first light emitting unit including an n-type organic material layer (311) formed on the first conductive layer, a p-type hole transporting layer (312) forming an NP junction on the n-type organic material layer, a first light emitting layer (313) and an electron transporting layer (314); an intermediate conductive layer (330); a second light emitting unit including an n-type organic material layer (321) formed on the intermediate conductive layer, a p-type hole transporting layer (322) forming an NP junction on the n-type organic material layer, a second light emitting layer (323), and an electron transporting layer (324); and a second conductive layer (320). The light emitting layer and the electron transporting layer can be formed of the same organic materials or different organic materials.

In the stacked organic light emitting device as show in FIG. 4, the first conductive layer, the second conductive layer, and the intermediate conductive layer are connected with each other via a pulse generator (350). In this structure, if a negative voltage is applied to the intermediate conductive layer, the potential of the intermediate conductive layer is lower than those of the first conductive layer and the second conductive layer. From this, the first light emitting unit configured such that the first conductive layer is operated as an anode electrode, and the intermediate conductive layer is operated as a cathode electrode emits light by application of a forward voltage. Meanwhile, the second light emitting unit configured such that intermediate conductive layer is operated as an anode electrode, and the second conductive layer is operated as a cathode electrode does not emit light by a reverse voltage. To the contrary, if a positive voltage is applied to the intermediate conductive layer, the potential of the intermediate conductive layer is higher than those of the first conductive layer and the second conductive layer. From this, the first light emitting unit configured such that the first conductive layer is operated as an anode electrode, and the intermediate conductive layer is operated as a cathode electrode does not emit light by application of a reverse voltage. Meanwhile, the second light emitting unit configured such that intermediate conductive layer is operated as an anode electrode, and the second conductive layer is operated as a cathode electrode emits light by a forward voltage. Based on this principle, the first light emitting unit and the second light emitting unit each independently emit light, perform color control through the selective regulation of the driving time and light emission luminance of the first light emitting unit and the second light emitting unit by controlling the time and the voltage intensity upon alternately applying a positive voltage and a negative voltage, whereby it can be employed in various devices.

According to still another embodiment of the present invention, there is provided a stacked organic light emitting device, comprising a first conductive layer, a first light emitting unit, a first intermediate conductive layer, a second light emitting unit, a second intermediate conductive layer, a third light emitting unit and a second conductive layer, wherein the first conductive layer and the second intermediate conductive layer are conductive layers belonging to Group 1 such that they are electrically connected with each other to a common potential; the first intermediate conductive layer and the second conductive layer are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

Figure 8:
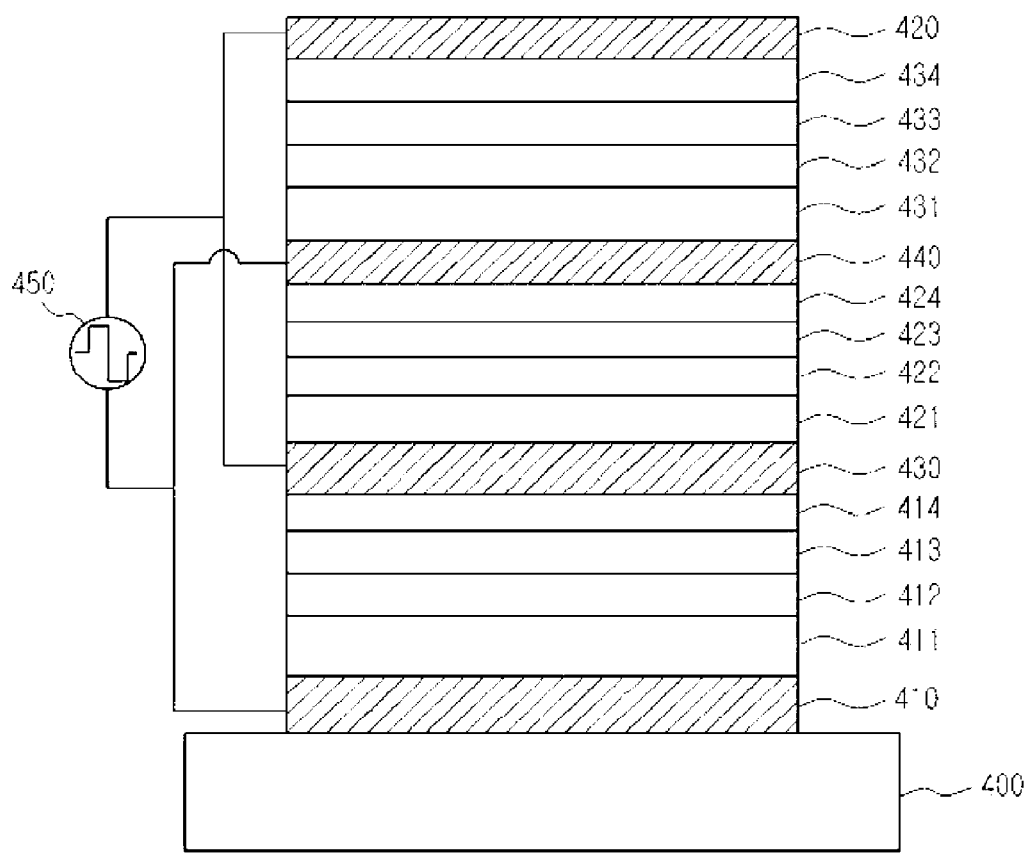
FIGS. 8 and 9 are a schematic cross-sectional diagram illustrating the stacked organic light emitting device comprising two intermediate conductive layers and a pulse generator, according to one embodiment of the present invention, and a schematic diagram of the equivalent circuit in the structure, respectively.
Figure 9:
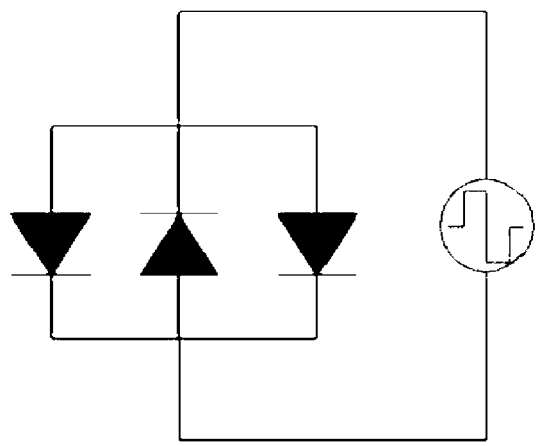

This embodiment relates to one of the organic light emitting devices comprising trilayered light emitting units, having a structure in which the external conductive layer and the intermediate conductive are electrically connected with each other to a common potential, and its structure is illustrated in FIG. 8. FIG. 9 shows the equivalent circuit in the structure as shown in FIG. 8.

The stacked organic light emitting device as shown in FIG. 8 comprises a substrate (400); a first conductive layer (410) positioned on the substrate (400); a first light emitting unit including an n-type organic material layer (411) formed on the first conductive layer, a p-type hole transporting layer (412) forming an NP junction on the n-type organic material layer, a first light emitting layer (413), and an electron transporting layer (414); a first intermediate conductive layer (430); a second light emitting unit including an n-type organic material layer (421) formed on the first intermediate conductive layer, a p-type hole transporting layer (422) forming an NP junction on the n-type organic material layer, a second light emitting layer (423), and an electron transporting layer (424); a second intermediate conductive layer (440); a third light emitting unit including an n-type organic material layer (431) formed on the second intermediate conductive layer, a p-type hole transporting layer (432) forming an NP junction on the n-type organic material layer, a third light emitting layer (433), and an electron transporting layer (434); and a second conductive layer (420). The light emitting layer and the electron transporting layer can be formed of the same organic materials or different organic materials. In this structure, the first conductive layer (410) and the second intermediate conductive layer (440) are conductive layers belonging to Group 1 such that they are electrically connected with each other to a common potential, and the second conductive layer (420) and the first intermediate conductive layer (430) are conductive layers belonging to Group 2 such that they are electrically connected with each other to a common potential. The conductive layers belonging to Group 1 and the conductive layers belonging to Group 2 are connected with each other via a pulse generator (450) to a common potential for alternately applying a positive voltage and a negative voltage. If a positive voltage and a negative voltage are alternately applied from the pulse generator (450), the first light emitting unit, the third light emitting unit, and the second light emitting unit each independently emit light.

Figure 10:
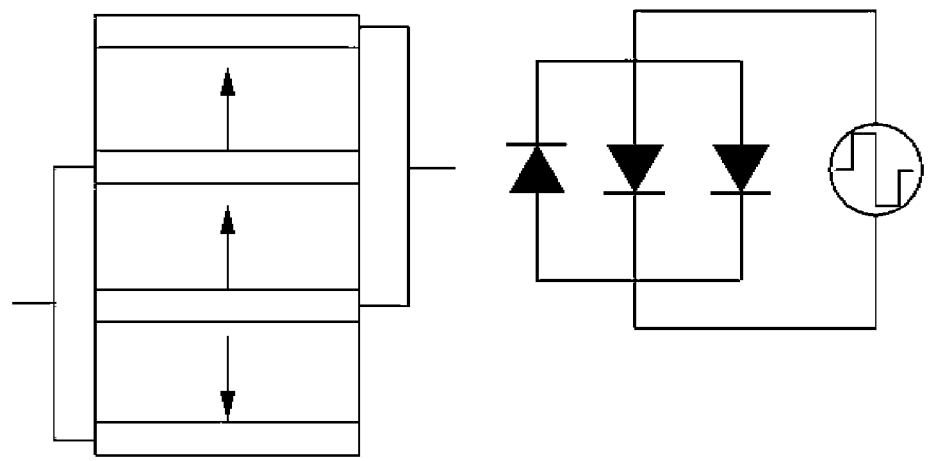
FIGS. 10 and 11 are a schematic cross-sectional diagram illustrating the stacked organic light emitting device comprising two intermediate conductive layers according to embodiments of the present invention, and a schematic diagram of the equivalent circuit in the structure.
Figure 11:
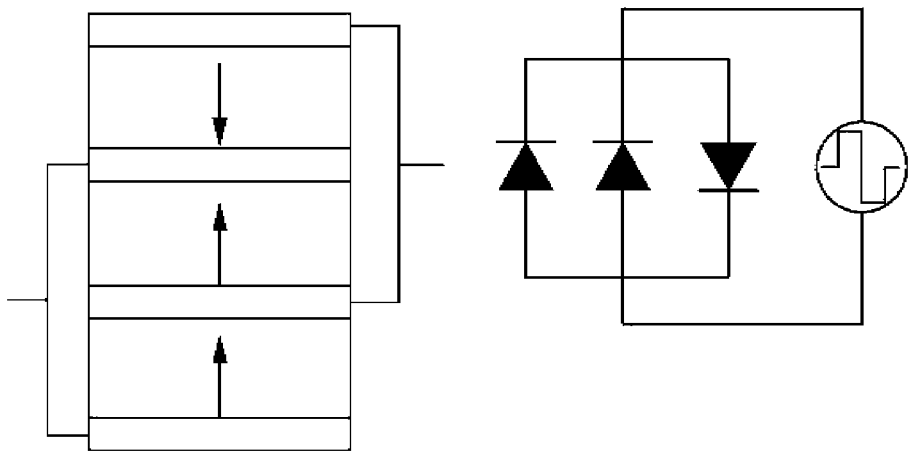

FIG. 10 and FIG. 11 illustrate equivalent circuits according to the stacking sequence of the organic material layers of each light emitting unit in the organic light emitting devices comprising the trilayered light emitting unit having the same conductive layer connection structure as in FIG. 8. In FIG. 10 and FIG. 11, the arrow represents the stacking sequence of the organic material layers of the light emitting units, wherein the organic material layers in each light emitting unit can comprise the hole injecting layer on the starting point of the arrow, the hole transporting layer, the light emitting layer, and the electron transporting layer on the ending point of the arrow.

According to still another embodiment of the present invention, there is provided a stacked organic light emitting device, comprising a first conductive layer, a first light emitting unit, a first intermediate conductive layer, a second light emitting unit, a second intermediate conductive layer, a third light emitting unit and a second conductive layer, wherein the first conductive layer and the second conductive layer are conductive layers belonging to Group 1 such that they are electrically connected with each other to a common potential; and any one of the first intermediate conductive layer and the second intermediate conductive layer, and the conductive layers belonging to Group 1 are connected with each other via a voltage regulator for alternately applying a positive voltage and a negative voltage.

Figure 12:
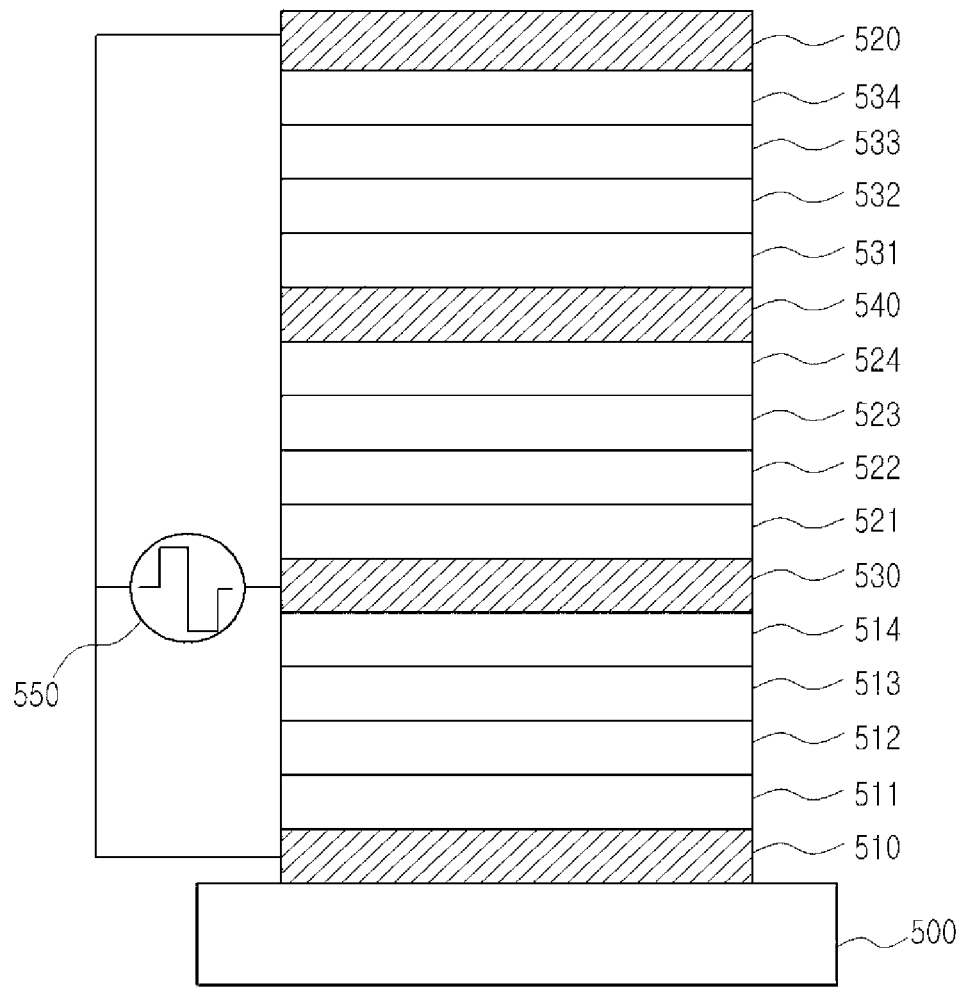
FIGS. 12 and 13 are a schematic cross-sectional diagram illustrating the stacked organic light emitting device comprising two intermediate conductive layers and a pulse generator, according to one embodiment of the present invention, and a schematic diagram of the equivalent circuit in the structure, respectively.
Figure 13:
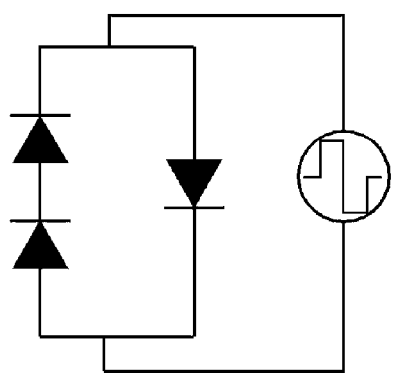

This embodiment relates to one of the organic light emitting devices comprising trilayered light emitting units, which has a structure such that the external conductive layers are electrically connected to a common potential, and its structure is illustrated in FIG. 12. FIG. 13 illustrates the equivalent circuit of the structure in FIG. 12.

The stacked organic light emitting device as shown in FIG. 12 comprises a substrate (500); a first conductive layer (510) positioned on the substrate (500); a first light emitting unit including an n-type organic material layer (511) formed on the first conductive layer, a p-type hole transporting layer (512) forming an NP junction on the n-type organic material layer, a first light emitting layer (513), and an electron transporting layer (514); a first intermediate conductive layer (530); a second light emitting unit including an n-type organic material layer (521) formed on the first intermediate conductive layer, a p-type hole transporting layer (522) forming an NP junction on the n-type organic material layer, a second light emitting layer (523), and an electron transporting layer (524); a second intermediate conductive layer (540); a third light emitting unit including an n-type organic material layer (531) formed on the second intermediate conductive layer, a p-type hole transporting layer (532) forming an NP junction on the n-type organic material layer, a third light emitting layer (533), and an electron transporting layer (534); and a second conductive layer (520). The light emitting layer and the electron transporting layer can be formed of the same organic materials or different organic materials. The first conductive layer (510) and the second conductive layer (520) are the conductive layers belonging to Group 1 such that they are electrically connected with each other, and the conductive layers belonging to Group 1 and the first intermediate conductive layer are connected with each other via a pulse generator. If a positive voltage and a negative voltage are alternately applied from the pulse generator (550), the first light emitting unit and the second light emitting unit, the third light emitting unit each independently emit light.

According to still another embodiment of the present invention, there is provided a stacked organic light emitting device, comprising a first conductive layer, a first light emitting unit, a first intermediate conductive layer, a second light emitting unit, a second intermediate conductive layer, a third light emitting unit, a third intermediate conductive layer, a fourth light emitting unit and a second conductive layer, wherein the first conductive layer and the second intermediate conductive layer are conductive layers belonging to Group 1 such that they are electrically connected with each other to a common potential; the second conductive layer and the first intermediate conductive layer are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

Figure 14:
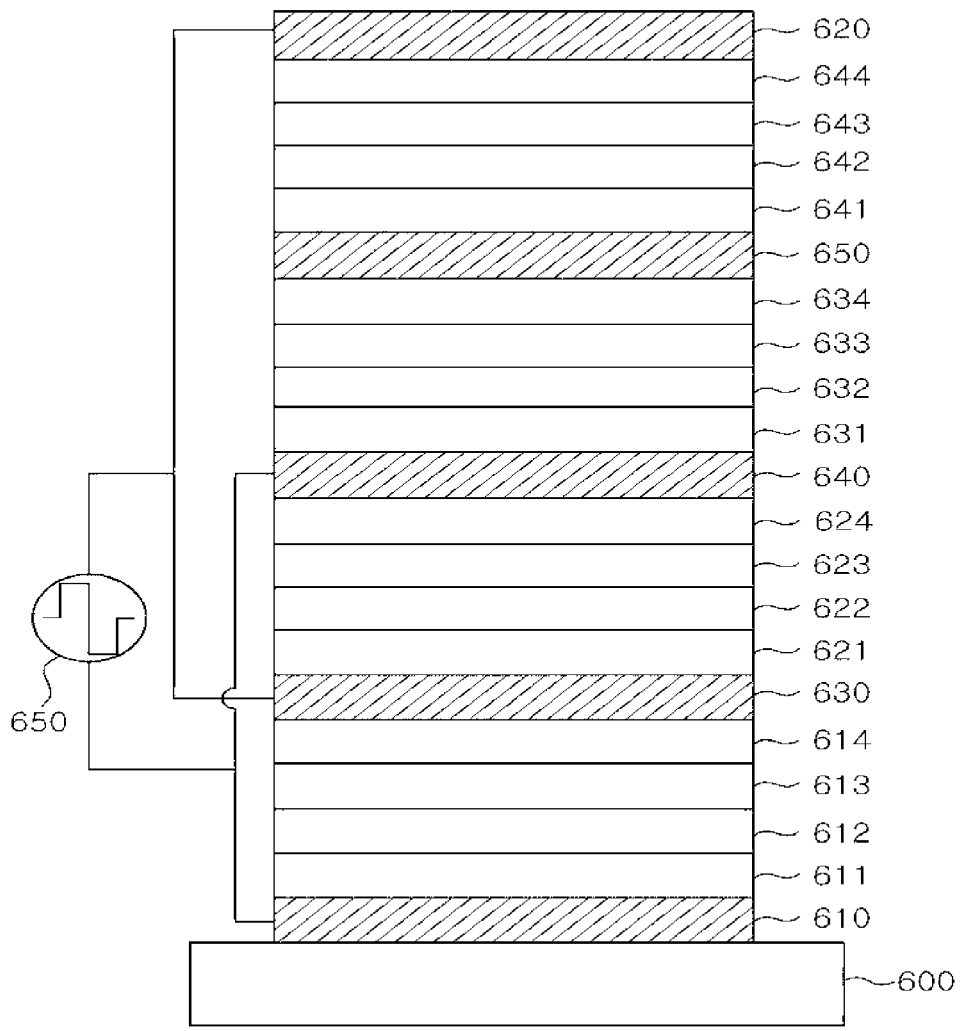
FIGS. 14 and 15 are a schematic cross-sectional diagram illustrating the stacked organic light emitting device comprising three intermediate conductive layers and a pulse generator, according to one embodiment of the present invention, and a schematic diagram of the equivalent circuit in the structure, respectively.
Figure 15:
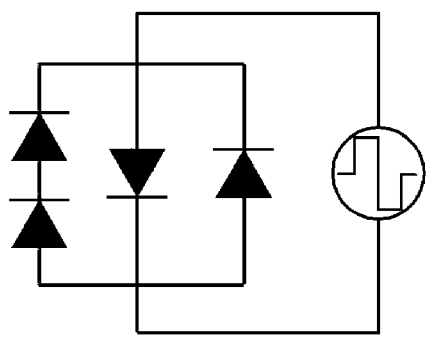

This embodiment relates to one of the organic light emitting devices comprising tetralayered light emitting units, which has a structure such that the external conductive layer and the intermediate conductive layer are electrically connected to a common potential structure, and its structure is illustrated in FIG. 14. FIG. 15 illustrates the equivalent circuit of the structure in FIG. 14.

The stacked organic light emitting device as shown in FIG. 14 comprises a substrate (600); a first conductive layer (610) positioned on the substrate (600); a first light emitting unit including an n-type organic material layer (611) formed on the first conductive layer, a p-type hole transporting layer (612) forming an NP junction on the n-type organic material layer, a first light emitting layer (613), and an electron transporting layer (614); a first intermediate conductive layer (630); a second light emitting unit including an n-type organic material layer (621) formed on the first intermediate conductive layer, a p-type hole transporting layer (622) forming an NP junction on the n-type organic material layer, a second light emitting layer (623), and an electron transporting layer (624); a second intermediate conductive layer (640); a third light emitting unit including an n-type organic material layer (631) formed on the second intermediate conductive layer, a p-type hole transporting layer (632) forming an NP junction on the n-type organic material layer, a third light emitting layer (633), and an electron transporting layer (634); a third intermediate conductive layer (650); a fourth light emitting unit including an n-type organic material layer (641) formed on the third intermediate conductive layer, a p-type hole transporting layer (642) forming an NP junction on the n-type organic material layer, a fourth light emitting layer (643) and an electron transporting layer (644); and a second conductive layer (620). The light emitting layer and the electron transporting layer can be formed of the same organic materials or different organic materials. In this structure, the first conductive layer (610) and the second intermediate conductive layer (640) are electrically connected to a common potential, and the first intermediate conductive layer (630) and the second conductive layer (620) are electrically connected to a common potential. The conductive layers belonging to the two groups are connected with each other via a pulse generator, and if a positive voltage and a negative voltage are alternately applied from the pulse generator, the first light emitting unit, the third light emitting unit, the fourth light emitting unit, and the second light emitting unit each independently emit light.

Figure 16:
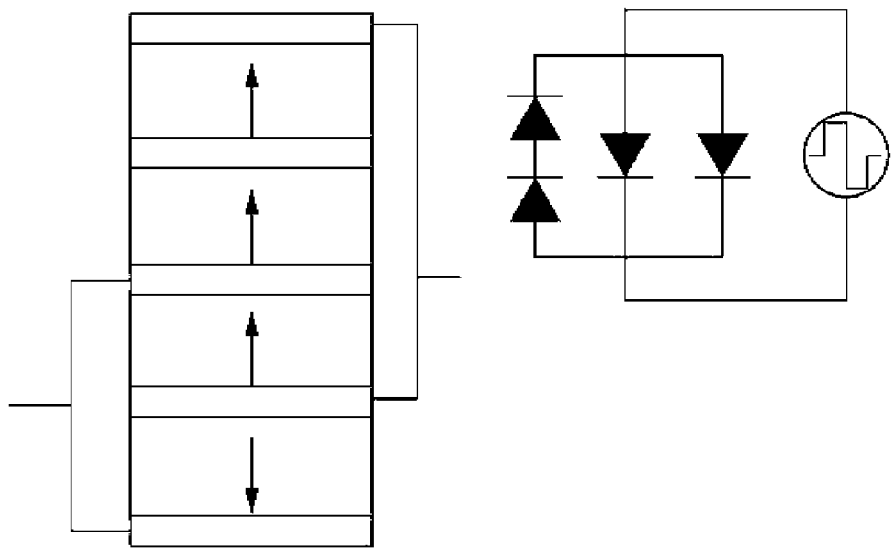
FIG. 16 is a schematic cross-sectional diagram illustrating the stacked organic light emitting device comprising three intermediate conductive layers and a pulse generator, according to one embodiment of the present invention.

FIG. 16 illustrates an equivalent circuit according to the stacking sequence of the organic material layers of each light emitting unit in the organic light emitting devices comprising the tetralayered light emitting unit having the same electrode connection structure as in FIG. 14. In FIG. 16, the arrow represents the stacking sequence of the organic material layers of the light emitting units, wherein the organic material layers in each light emitting unit can comprise the hole injecting layer on the starting point of the arrow, the hole transporting layer, the light emitting layer, and the electron transporting layer on the ending point of the arrow.

According to still another embodiment of the present invention, there is provided a stacked organic light emitting device, comprising a first conductive layer, a first light emitting unit, a first intermediate conductive layer, a second light emitting unit, a second intermediate conductive layer, a third light emitting unit, a third intermediate conductive layer, a fourth light emitting unit and a second conductive layer, wherein the first conductive layer and second conductive layer are conductive layer belonging to Group 1 such that they are electrically connected with each other to a common potential; and at least one of the first intermediate conductive layer, the second intermediate conductive layer and the third intermediate conductive layer, and the conductive layers belonging to Group 1 are connected with each other via a voltage regulator for alternately applying a positive voltage and a negative voltage.

Figure 17:
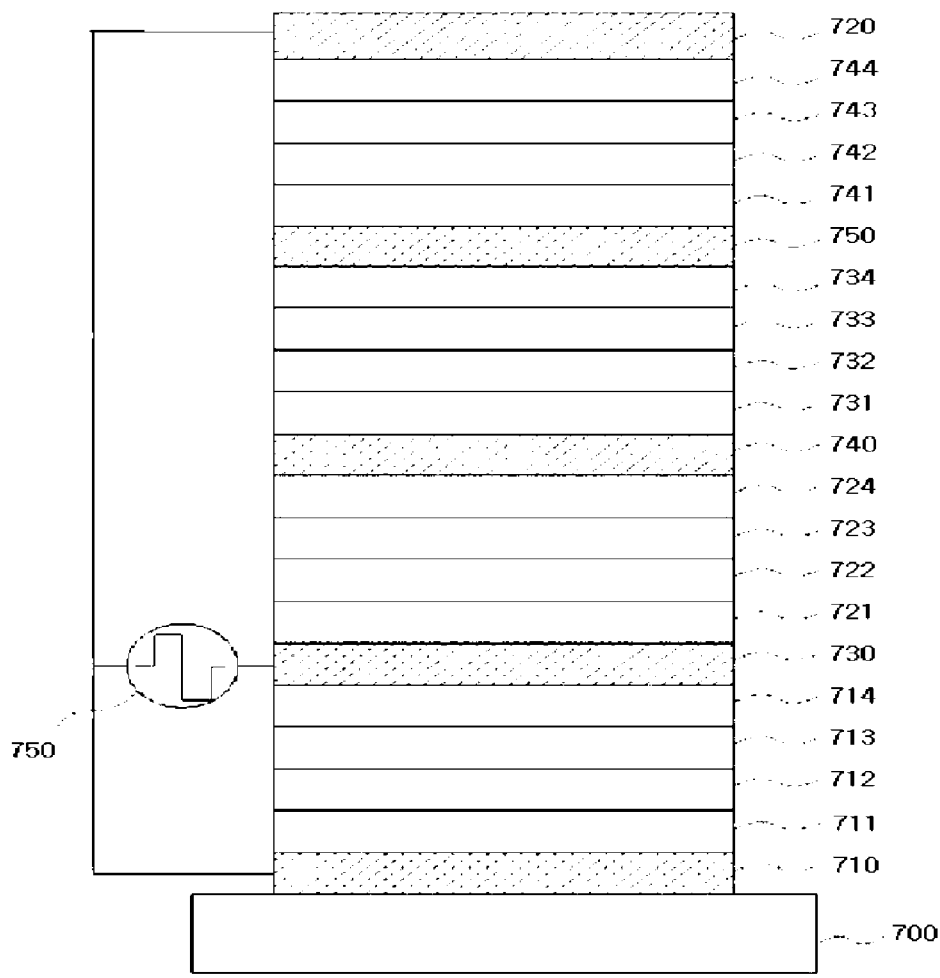
FIGS. 17 and 18 are a schematic cross-sectional diagram illustrating the stacked organic light emitting device comprising three intermediate conductive layers and a pulse generator, according to one embodiment of the present invention, and a schematic diagram of the equivalent circuit in the structure, respectively.
Figure 18:
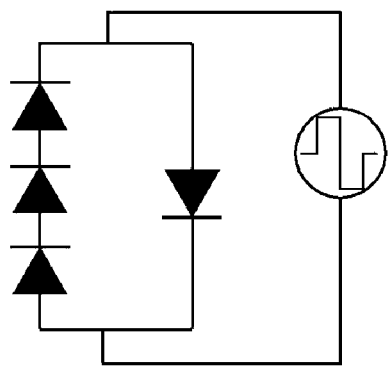

This embodiment relates to one of the organic light emitting devices comprising tetralayered light emitting units, which has a structure such that the external conductive layers are electrically connected to a common potential, and its structure is illustrated in FIG. 17. FIG. 18 illustrates the equivalent circuit of the structure in FIG. 17.

The stacked organic light emitting device as shown in FIG. 17 comprises a substrate (700); a first conductive layer (710) positioned on the substrate (700); a first light emitting unit including an n-type organic material layer (711) formed on the first conductive layer, a p-type hole transporting layer (712) forming an NP junction on the n-type organic material layer, a first light emitting layer (713), and an electron transporting layer (714); a first intermediate conductive layer (730); a second light emitting unit including an n-type organic material layer (721) formed on the first intermediate conductive layer, a p-type hole transporting layer (722) forming an NP junction on the n-type organic material layer, a second light emitting layer (723), and an electron transporting layer (724); a second intermediate conductive layer (740); a third light emitting unit including an n-type organic material layer (731) formed on the second intermediate conductive layer, a p-type hole transporting layer (732) forming an NP junction on the n-type organic material layer, a third light emitting layer (733), and an electron transporting layer (734); a third intermediate conductive layer (750); a fourth light emitting unit including an n-type organic material layer (741) formed on the third intermediate conductive layer, a p-type hole transporting layer (742) forming an NP junction on the n-type organic material layer, a fourth light emitting layer (743) and an electron transporting layer (744); and a second conductive layer (720). The light emitting layer and the electron transporting layer can be formed of the same organic materials or different organic materials. In this structure, the first conductive layer (710) and the second conductive layer (720) are electrically connected to a common potential. The external conductive layers and the first intermediate conductive layer are connected with each other via a pulse generator (750), and if a positive voltage and a negative voltage are alternately applied from the pulse generator (750), the first light emitting unit, and the second light emitting unit, the third light emitting unit and the fourth light emitting unit each independently emit light.

According to still another embodiment of the present invention, there is provided a stacked organic light emitting device, comprising a first conductive layer, a first light emitting unit, a first intermediate conductive layer, a second light emitting unit, a second intermediate conductive layer, a third light emitting unit, a third intermediate conductive layer, a fourth light emitting unit and a second conductive layer, wherein the first conductive layer, the second intermediate conductive layer and the second conductive layer are conductive layers belonging to Group 1 such that they are electrically connected with each other to a common potential; the first intermediate conductive layer and the third intermediate conductive layer are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

Figure 19:
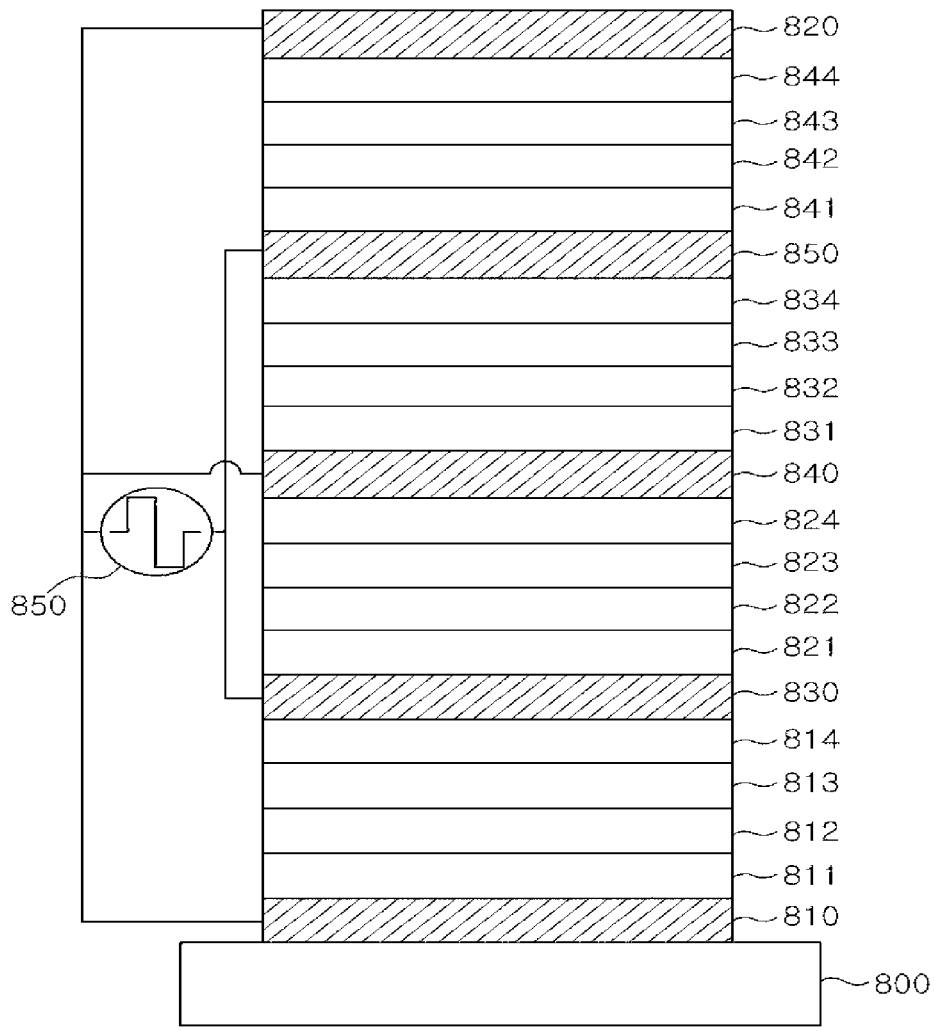
FIGS. 19 and 20 are a schematic cross-sectional diagram illustrating the stacked organic light emitting device comprising three intermediate conductive layers and a pulse generator, according to one embodiment of the present invention, and a schematic diagram of the equivalent circuit in the structure, respectively.
Figure 20:
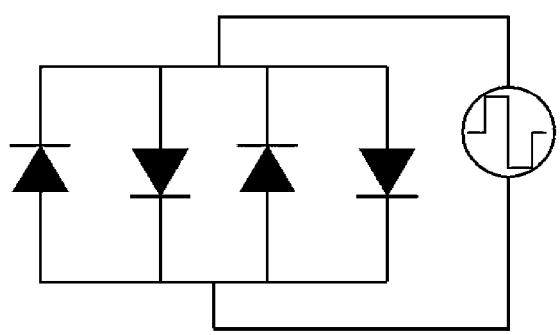

This embodiment relates to one of the organic light emitting devices comprising tetralayered light emitting units, which has a structure such that the external conductive films are electrically connected to a common potential, and the intermediate conductive layers are electrically connected to a common potential, and its structure is illustrated in FIG. 19. FIG. 20 illustrates the equivalent circuit of the structure in FIG. 19.

The stacked organic light emitting device as show in FIG. 19 comprises a substrate (800); a first conductive layer (810) positioned on the substrate (800); a first light emitting unit including an n-type organic material layer (811) formed on the first conductive layer, a p-type hole transporting layer (812) forming an NP junction on the n-type organic material layer, a first light emitting layer (813), and an electron transporting layer (814); a first intermediate conductive layer (830); a second light emitting unit including an n-type organic material layer (821) formed on the first intermediate conductive layer, a p-type hole transporting layer (822) forming an NP junction on the n-type organic material layer, a second light emitting layer (823), and an electron transporting layer (824); a second intermediate conductive layer (840); a third light emitting unit including an n-type organic material layer (831) formed on the second intermediate conductive layer, a p-type hole transporting layer (832) forming an NP junction on the n-type organic material layer, a third light emitting layer (833), and an electron transporting layer (834); a third intermediate conductive layer (850); a fourth light emitting unit including an n-type organic material layer (841) formed on the third intermediate conductive layer, a p-type hole transporting layer (842) forming an NP junction on the n-type organic material layer, a fourth light emitting layer (843) and an electron transporting layer (844); and a second conductive layer (820). The light emitting layer and the electron transporting layer can be formed of the same organic materials or different organic materials. In this structure, the first conductive layer (810), the second conductive layer (820) and the second intermediate conductive layer (840) are conductive layers belonging to Group 1 such that they are electrically connected with each other to a common potential, and the first intermediate conductive layer (830) and the third intermediate conductive layer (850) are conductive layers belonging to Group 2 such that they are electrically connected with each other to a common potential. The conductive layers belonging to Group 1 and the conductive layers belonging to Group 2 are connected with each other via a pulse generator (850). If a positive voltage and a negative voltage are alternately applied from the pulse generator (850), the first light emitting unit, the third light emitting unit, and the second light emitting unit, the fourth light emitting unit each independently emit light.

Figure 21:
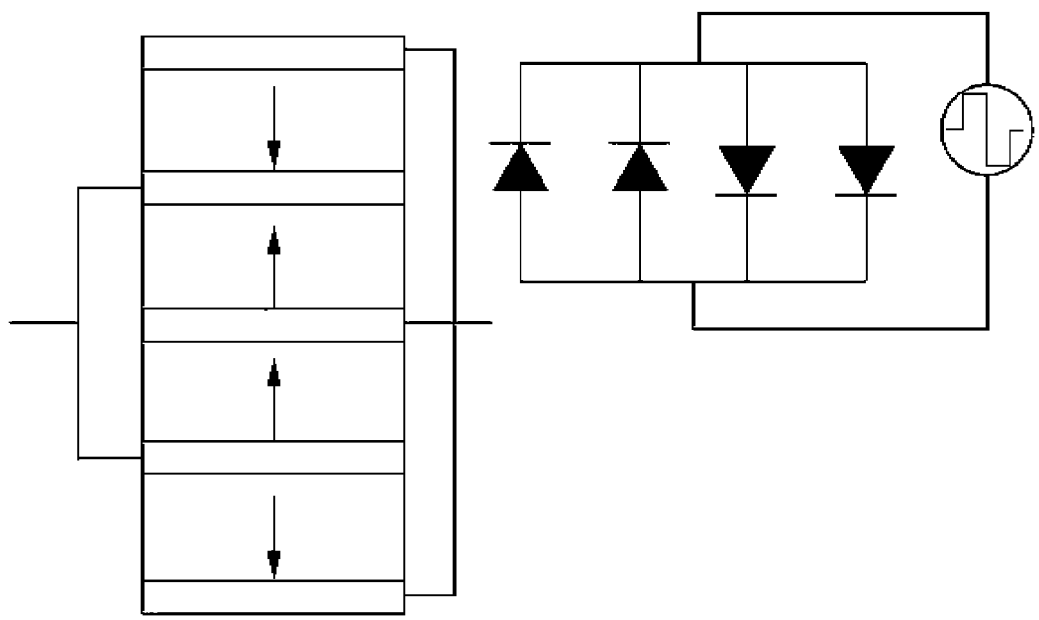
FIG. 21 is a schematic cross-sectional diagram illustrating the stacked organic light emitting device comprising three intermediate conductive layers, according to embodiments of the present invention, and a schematic diagram of the equivalent circuit in the structure.

FIG. 21 illustrates the structure and the equivalent circuit of the organic light emitting device having different stacking sequences of the light emitting units in the organic light emitting devices comprising the tetralayered light emitting unit with the same electrode connection structure as in FIG. 19. In FIG. 21, the arrow represents the stacking sequence of the organic material layers of the light emitting units, wherein the organic material layers in each light emitting unit can comprise the hole injecting layer on the starting point of the arrow, the hole transporting layer, the light emitting layer, and the electron transporting layer on the ending point of the arrow.

The stacked organic light emitting device according to the present invention can be a bottom emission device, a top emission device, or a top-and-bottom emission device. In the stacked organic light emitting device according to the present invention, the first conductive layer can be an anode electrode, and the second conductive layer can be a cathode electrode. To the contrary, the first conductive layer can be a cathode electrode, and the second conductive layer can be an anode electrode.

In the stacked organic light emitting device according to the present invention, the intermediate conductive layer is formed of transparent materials, or formed of thin layer to be substantially transparent. The intermediate conductive layer can have a structure in which an intermediate cathode electrode layer and an intermediate anode electrode layer are stacked, or can comprise a single conductive layer.

In the present invention, the first conductive layer, the second conductive layer and the intermediate conductive layers can be formed of the same organic materials.

In the stacked organic light emitting device according to the present invention, the light emitting units can be the same as or different from each other. Each of the stacked light emitting units can each independently comprise at least one layer of a light emitting layer, a hole injecting layer, a hole transporting layer, an electron transporting layer and an electron injecting layer. The light emitting units contained in the stacked organic light emitting device according to the present invention can comprise a light emitting layer formed of different materials.

In the stacked organic light emitting device according to the present invention, the stacking sequence of each of the light emitting units may be different from each other. For example, for each of the light emitting units, a hole injecting layer, a hole transporting layer, a light emitting layer, an electron transporting layer and an electron injecting layer can be stacked in this order, or an electron injecting layer, an electron transporting layer, a light emitting layer, a hole transporting layer and a hole injecting layer can be stacked in this order. However, each of the light emitting units can comprise fewer layers. Examples in which the stacking sequences of the light emitting units are different from each other are illustrated, but not limited thereto, in FIGS. 10, 11, 16 and 21, and various embodiments can be allowed within the scope of the present invention.

According to one embodiment of the present invention, the light emitting units can have a forward structure comprising a hole injecting layer, a hole transporting layer, a light emitting layer and an electron transporting layer, which are stacked in this order. According to still another embodiment of the present invention, the light emitting units can have a reverse structure comprising an electron transporting layer, a light emitting layer, a hole transporting layer, and a hole injecting layer, which are stacked in this order. According to still another embodiment of the present invention, the light emitting units can have both of a forward structure comprising a hole injecting layer, a hole transporting layer, a light emitting layer and an electron transporting layer, which are stacked in this order, and a reverse structure comprising an electron transporting layer, a light emitting layer, a hole transporting layer and a hole injecting layer, which are stacked in this order.

In the present invention, the hole injecting ability is improved by lowering the energy barrier for injecting holes from the conductive layer to the p-type organic material layer of the light emitting unit, and at the same time, the conductive layer can be formed of various conductive materials by having an n-type organic material layer on the conductive layers to form an NP junction with the p-type organic material layer, wherein their energy levels of the layers satisfy the following equations:

$$E_{nL} - E_F \leq 4 \text{ eV} \tag{1}$$

$$E_{pH} - E_{nL} \leq 1 \text{ eV} \tag{2}$$

In the above equations (1) and (2), $E_F$ is a Fermi energy level of the conductive layer adjacent to the n-type organic material layer, $E_{nL}$ is a LUMO (lowest unoccupied molecular orbital) energy level of the type organic material layer, and $E_{pH}$ is HOMO (highest occupied molecular orbital) energy level of the p-type organic material layer.

Therefore, in the stacked organic light emitting device according to the present invention, at least one of the light emitting units comprises an n-type organic material layer adjacent to any one conductive layer, and a p-type organic material layer to form an NP junction with the n-type organic material layer, and their energy levels satisfy the above-described equations (1) and (2).

According to one embodiment of the present invention, the (n+1)th light emitting unit from the first conductive layer comprises an n-type organic material layer adjacent to the (n)th intermediate conductive layer from the first conductive layer, wherein n is an integer of 1 or more, and a p-type organic material layer to form an NP junction with the n-type organic material layer, and their energy levels satisfy the above-described equations (1) and (2). The device of this embodiment can be employed in a forward structure, that is, a structure in which the first conductive layer is an anode, and the second conductive layer is a cathode.

According to another embodiment of the present invention, the light emitting unit adjacent to the first conductive layer comprises an n-type organic material layer adjacent to the first conductive layer, and a p-type organic material layer to form an NP junction with the n-type organic material layer, and their energy levels satisfy the above-described equations (1) and (2). The device of this embodiment can be employed in a forward structure, that is, a structure in which the first conductive layer is an anode, and the second conductive layer is a cathode.

According to still another embodiment of the present invention, the (n)th light emitting unit from the first conductive layer comprises an n-type organic material layer adjacent to the (n)th intermediate conductive layer from the first conductive layer, wherein n is an integer of 1 or more, and a p-type organic material layer to form an NP junction with the n-type organic material layer, and their energy levels satisfy the above-described equations (1) and (2). The device of this embodiment can be employed in a reverse structure, that is, a structure in which the first conductive layer is a cathode, and the second conductive layer is an anode.

According to still another embodiment of the present invention, the light emitting unit adjacent to the second conductive layer comprises an n-type organic material layer adjacent to the second conductive layer, and a p-type organic material layer to form an NP junction with the n-type organic material layer, and their energy levels satisfy the above-described equations (1) and (2). The device of this embodiment can be employed in a reverse structure, that is, a structure in which the first conductive layer is a cathode, and the second conductive layer is an anode.

In the present invention, each n-type organic material layer can serve as a hole injecting layer in each light emitting unit.

In the present invention, the n-type organic material layer can be formed of materials, which can be subject to vacuum deposition or thin film molded using a solution process. Specific examples of the materials for forming the n-type organic material layer include the compound of the following formula 1, but not limited thereto:

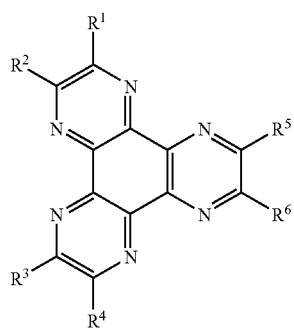

[Formula 1]

wherein $R^1$ to $R^6$ are each independently selected from the group consisting of hydrogen, a halogen atom, nitrile (—CN), nitro (—NO$_2$), sulfonyl (—SO$_2$R$^{11}$), sulfoxide (—SOR$^{11}$), sulfonamide (—SO$_2$NR$^{11}$R$^{12}$), sulfonate (—SO$_3$R$^{11}$), trifluoromethyl (—CF$_3$), ester (—COOR$^{11}$), amide (—CONHR$^{11}$ or —CONR$^{11}$R$^{12}$), substituted or unsubstituted linear or branched $C_1$-$C_{12}$ alkoxy, substituted or unsubstituted linear or branched $C_1$-$C_{12}$ alkyl, substituted or unsubstituted aromatic or non-aromatic heterocycle, substituted or unsubstituted aryl, substituted or unsubstituted mono-arylamine or di-arylamine, and substituted or unsubstituted aralkylamine. In addition, $R^{11}$ and $R^{12}$ are selected from the group consisting of substituted or unsubstituted $C_1$-$C_{60}$ alkyl, substituted or unsubstituted aryl, and substituted or unsubstituted 5- to 7-membered heterocycle.

Specific examples of the compound of the formula 1 include the compounds represented by the following formulae 1-1 to 1-6, but not limited thereto:

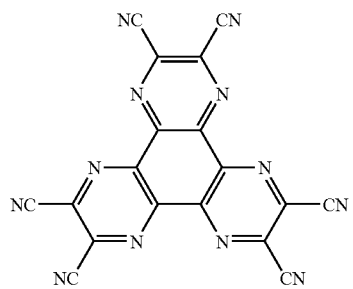

[Formula 1-1]

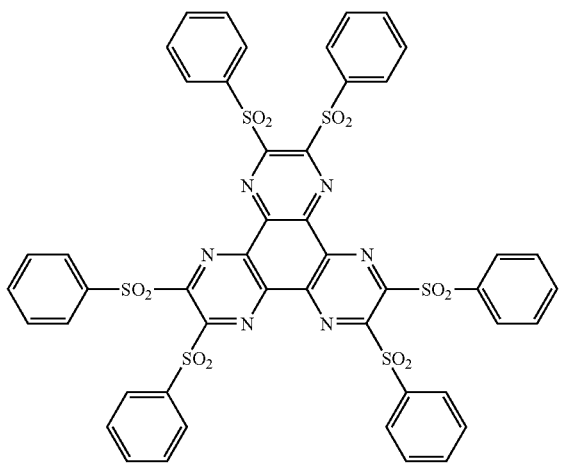

[Formula 1-2]

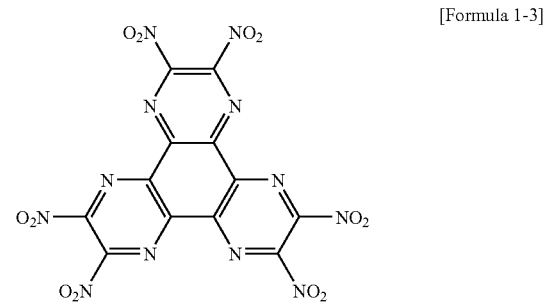

[Formula 1-3]

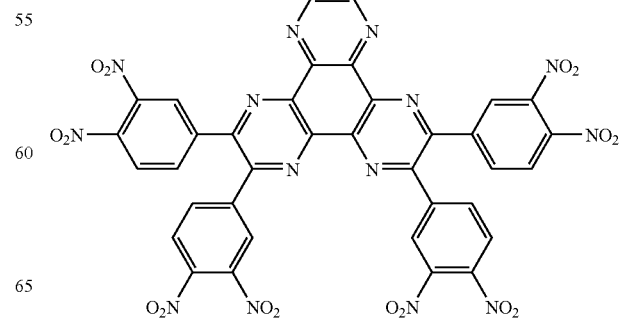
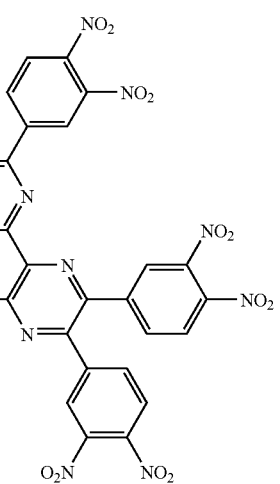

[Formula 1-4]

-continued

[Formula 1-5]

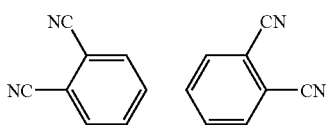

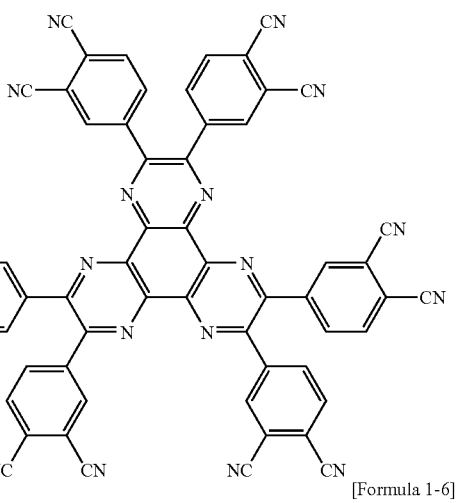

[Formula 1-6]

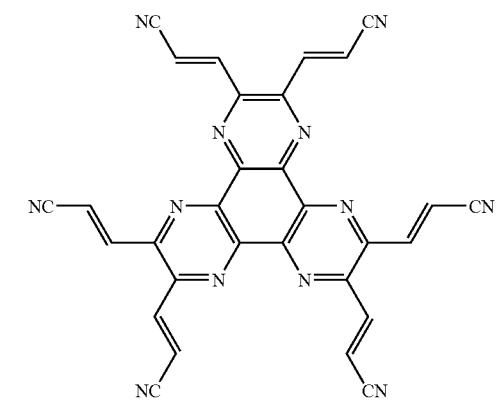

Furthermore, examples of the materials for forming the n-type organic material layer include 2,3,5,6-tetrafluoro-7,7,8,8-tetracyanoquinodimethane (F4TCNQ), fluorine-substituted 3,4,9,10-perylenetetracarboxylic dianhydride (PTCDA), cyano-substituted 3,4,9,10-perylenetetracarboxylic dianhydride (PTCDA), naphthalenetetracarboxylicdianhydride (NTCDA), fluorine-substituted naphthalenetetracarboxylicdianhydride (NTCDA), and cyano-substituted naphthalenetetracarboxylicdianhydride (NTCDA).

The p-type organic material layer to form an NP junction with the n-type organic material layer can serve as a hole injecting layer (HIL), a hole transporting layer (HTL) or a light emitting layer (EML). The holes formed in the NP junction of the n-type organic material layer and the p-type organic material layer can be transported to a light emitting region via the p-type hole injecting layer, the p-type hole transporting layer or the p-type light emitting layer. The HOMO energy level of the p-type hole injecting layer, the p-type hole transporting layer or the p-type light emitting layer has an energy level difference of about 1 eV or less from that of the LUMO energy level of the n-type organic material layer, for example, and preferably about 0.5 eV or less. Examples of the materials for forming the p-type organic material layer include an arylamine-based compound, a conductive polymer, and a block copolymer having both of conjugated and non-conjugated portions, but not limited thereto.

At least two layers selected from the first conductive layer, the intermediate conductive layer and the second conductive layer by the NP junction can be formed of the same materials, and particularly the conductive layers can be formed of materials selected from Ca, Ca—Ag, Ag-IZO and Mg—Ag.

Meanwhile, in the preparation of the stacked organic light emitting device according to the present invention, it is preferable that the organic material layer to which the electrons are injected from the conductive layer with a cathode voltage being applied comprises a compound containing a functional group selected from an imidazole group, an oxazole group and a thiazole group, in order to prevent the reduction in electron injection characteristics due to contact between the cathode and organic material. The organic material layer to which the electrons are injected from the conductive layer with a cathode being applied can be an electron transporting layer. The method for improving the electron injection characteristics by formation of the organic material layer comprising the compound is effective for the cases wherein the stacked organic light emitting device according to the present invention has a reverse structure, in which the first conductive layer positioned on the substrate is a cathode electrode, and the second conductive layer positioned on the uppermost side is an anode electrode.

Preferable examples of the compound containing a functional group selected from an imidazole group, an oxazole group and a thiazole group include the compounds represented by the following formulae 2 or 3:

[Formula 2]

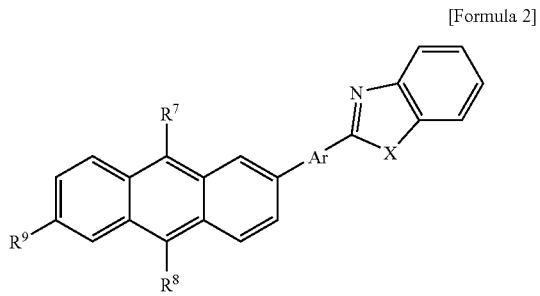

wherein $R^7$ and $R^8$ may be the same as or different from each other, and are each independently hydrogen, a $C_1$-$C_{20}$ aliphatic hydrocarbon, or an aromatic ring or aromatic heterocycle; Ar is an aromatic ring or aromatic heterocycle; $R^9$ is hydrogen, a $C_1$-$C_6$ aliphatic hydrocarbon, or an aromatic ring or aromatic heterocycle; X is O, S or $NR^{13}$; $R^{13}$ is hydrogen, a $C_1$-$C_7$ aliphatic hydrocarbon, or an aromatic ring or aromatic heterocycle; provided that $R^7$ and $R^8$ are not hydrogen at the same time;

[Formula 3]

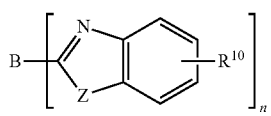

wherein Z is O, S or $NR^{14}$; $R^{10}$ and $R^{14}$ may be the same as or different from each other, and are each independently hydrogen, a $C_1$-$C_{24}$ alkyl, a $C_5$-$C_{20}$ aryl or heteroatom-containing substituted aryl, halogen or alkylene capable of forming a fused ring with a benzazole ring, or a heteroatom-containing alkylene; B, as a linking unit, is alkylene, arylene, substituted alkylene, or substituted arylene to link the multiple benzazoles to be conjugated or non-conjugated; and n is an integer of 3 to 8.

Hereinbelow, each of the components of the organic light emitting device according to the present invention will be described in detail.

First Conductive Layer

The first conductive layer can be formed of an anode material or a cathode material.

For example, in the case where the first conductive layer is formed of the anode material, it can be formed of a metal, a metal oxide or a conductive polymer. The conductive polymer can comprise the electroconductive polymers. The first conductive layer preferably has a Fermi energy level of about 2.5 to 5.5 eV. It is preferable that an n-type organic material layer is formed on the first conductive layers to form an NP junction with the p-type organic material layer, so that the conductive layer may be formed of various conductive materials by lowering the energy barrier for injecting holes from the first conductive layer to the p-type organic material layer of the first light emitting unit. Non-limitative examples of the conductive materials include carbon, aluminum, calcium, vanadium, chromium, copper, zinc, silver, gold, other metals, and an alloy thereof; zinc oxide, indium oxide, tin oxide, indium tin oxide (ITO), indium zinc oxide (IZO) and other similar metal oxides, metal-metal oxide laminates such as Ca—Ag and Ca-IZO. In the case that the organic light emitting device is of a top emission type, opaque materials excellent in light reflection, as well as the transparent materials can be used for the first conductive layer. In the case that the organic light emitting device is of a bottom emission type, transparent materials should be used for the first conductive layer, and if opaque materials are used, a thin film which is substantially transparent should be formed.

Intermediate Conductive Layer

In the stacked organic light emitting device according to the present invention, at least one intermediate conductive layer serves as a common electrode, which functions as an anode electrode, as well as a cathode electrode. The intermediate conductive layer can be in a stacked form comprising an intermediate cathode electrode layer and an intermediate anode electrode layer, or in a form comprising a single conductive layer. If the intermediate conductive layer is in the form of a single conductive layer, it is preferable that it is formed of transparent materials having a work function similar to that of the conventionally used cathode materials and a visible ray transmittance of 50% or more. If the opaque metal is used for the intermediate conductive layer, the thickness of the intermediate conductive layer should be sufficiently low such that it is substantially transparent. In particular, the intermediate conductive layer can be formed using Ca or Mg having a low work function, in this case, Ca, Ca—Ag, Ag-IZO or Ma—Ag is preferable. Particularly, if Ca-IZO is employed, the visible ray transmittance can be improved, and thus in the case of the stacked organic light emitting device, the luminance increases in proportion to the number of the units of the organic light emitting device stacked at a drive voltage. Accordingly, it is preferably used for the intermediate conductive layer in the organic light emitting device according to the present invention.

Second Conductive Layer

The second conductive layer can be formed of an anode material or a cathode material.

For example, if the second conductive layer is formed of the cathode material, materials having low work functions are preferably used for the second conductive layer for promoting electron injection. The second conductive layer can be formed of, but not limited thereto, metal such s magnesium, calcium, sodium, potassium, titanium, indium, yttrium, lithium, gadolinium, aluminum, silver, tin and lead, or an alloy thereof; and multilayer structure materials such as LiF/Al and LiO/Al.

The first conductive layer, the intermediate conductive layer and the second conductive layer can comprise the same organic materials or different organic materials, as described above.

Light Emitting Layer (EML)

Each light emitting unit of the stacked organic light emitting device according to the present invention comprises a light emitting layer. In the light emitting layer, hole transportation and electron transportation are performed at the same time, and thus the light emitting layer has both of the n-type characteristics and the p-type characteristics. The light emitting layer in which electron transportation is faster than hole transportation can be defined as an n-type light emitting layer, and the light emitting layer in which hole transportation is faster than electron transportation can be defined as a p-type light emitting layer.

Since in the n-type light emitting layer, electron transportation is faster than hole transportation, light emits around the interface between the hole transporting layer and the light emitting layer. Accordingly, if the LUMO level of the hole transporting layer is higher than the LUMO level of the light emitting layer, better light emitting efficiency can be obtained. Examples of the materials for the n-type light emitting layer include, but not limited thereto, aluminum tris(8-hydroxyquinoline) (Alq3); 8-hydroxyquinoline beryllium (BAlq); benzoxazole compounds, benzthiazole compounds or benzimidazole compounds; polyfluorene compounds; and silacyclopentadiene (silole) compounds.

Since in the p-type light emitting layer, hole transportation is faster than electron transportation, light emits around the interface between the electron transporting layer and the light emitting layer. Accordingly, if the H0UMO level of the electron transporting layer is lower than the LUMO level of the light emitting layer, better light emitting efficiency can be obtained.

In the case of using the p-type light emitting layer, the effect of enhancing the light emitting efficiency by the change in the LUMO levels of the hole transporting layer is lowered, as compared with the case of using the n-type light emitting layer. Therefore, in the case of using the p-type light emitting layer, a light emitting unit having an NP junction structure between the n-type organic material layer and the p-type light emitting layer can be prepared without use of the hole injecting layer and the hole transporting layer. Materials for the p-type light emitting layer are not limited, but they include carbazole compounds; anthracene compounds; polyphenylenevinylene (PPV) polymers; and spiro compounds.

Electron Transporting Layer (ETL)

Each light emitting unit of the stacked organic light emitting device according to the present invention can comprise an electron transporting layer. As the materials for the electron transporting layer, materials having a high electron mobility are preferable to receive electrons from the cathode to the light emitting layer. The materials for the electron transporting layer are not limited, but they include aluminum tris(8-hydroxyquinoline) (Alq3); Alq3 structure-containing organic compounds; hydroxyflavone-metal complex compounds; and silacyclopentadiene (silole) compounds.

MODE FOR THE INVENTION

Hereinafter, the stacked organic light emitting device according to the present invention will be described with reference to Examples.

Example 1

Double Stacked Organic Light Emitting Device

On a washed glass substrate, indium zinc oxide (IZO) was coated to a thicknesses of 1000 Å by vacuum deposition using a sputtering deposition apparatus, and on the formed conductive layer, HAT having the following structure was coated to a thicknesses of 500 Å by thermal vacuum deposition to form a transparent anode comprising the IZO and HAT n-type organic material layers.

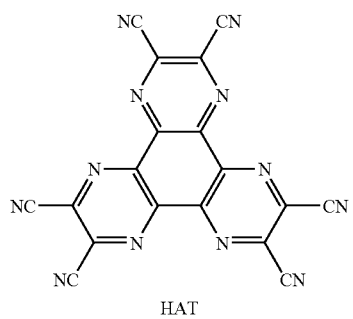

HAT

Then, on the HAT n-type organic material layer, 4,4'-bis[N-(1-naphthyl)-N-phenylamino]biphenyl (NPB) was coated to a thicknesses of 400 Å by vacuum deposition to form a p-type hole transporting layer. On the p-type hole transporting layer, a blue host material represented by the following formula 2-1 was doped with a blue dopant material represented by the following formula 2-2 to a concentration of 2%, and coated to a thicknesses of about 300 Å by vacuum deposition to form a light emitting layer. Then, on the light emitting layer, the following imidazole compound (PIMNA, HOMO level=about 5.7 eV) was coated to a thicknesses of 200 Å by vacuum deposition to form an electron transporting layer.

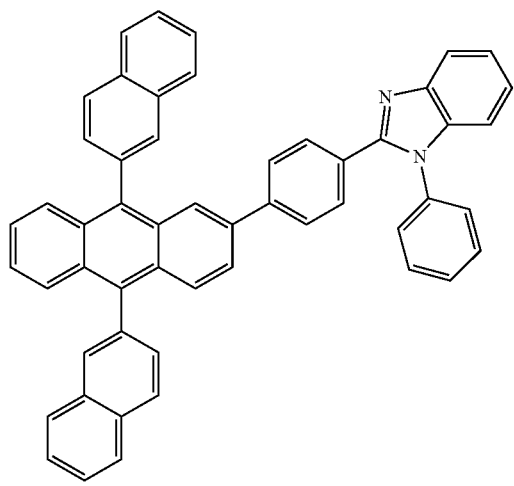

PIMNA

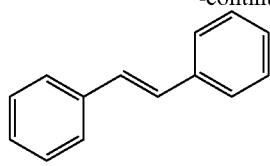

Formula 2-1

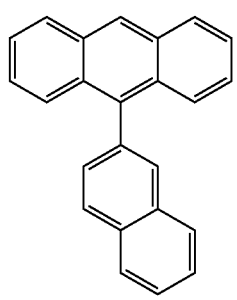

Formula 2-2

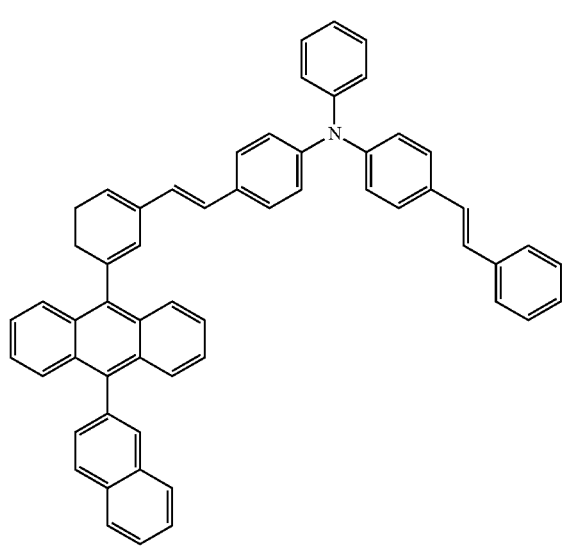

On the imidazole compound, a Ca intermediate electrode was coated to a thicknesses of 250 Å by thermal vacuum deposition, HAT was coated to a thicknesses of about 500 Å by thermal vacuum deposition, on HAT, NPB was coated to a thicknesses of about 400 Å by deposition, Alq3 was coated by deposition for the light emitting layer, and then imidazole compound was coated by deposition for the electron transporting layer.

On the electron transporting layer, a thin film of lithium fluoride (LiF) having a thickness of 15 Å and aluminum having a thickness of 1000 Å were coated by vacuum deposition to form a conductive layer. Then, an organic light emitting device is completed by forming a pulse voltage regulator on the Ca layer as the intermediate conductive layer and a ground electric potential on the Al and IZO conductive layers. In the above process, the deposition rate of the organic material was maintained at about 0.4 to 0.7 Å/sec, the deposition rate of LiF was maintained at about 0.3 Å/sec, and the deposition rate of calcium and aluminum was maintained at about 2 Å/sec. The degree of a vacuum in the deposition chamber upon deposition was maintained at about $2\times10^{-7}$ to $5\times10^{-8}$ torr.

Figure 22:
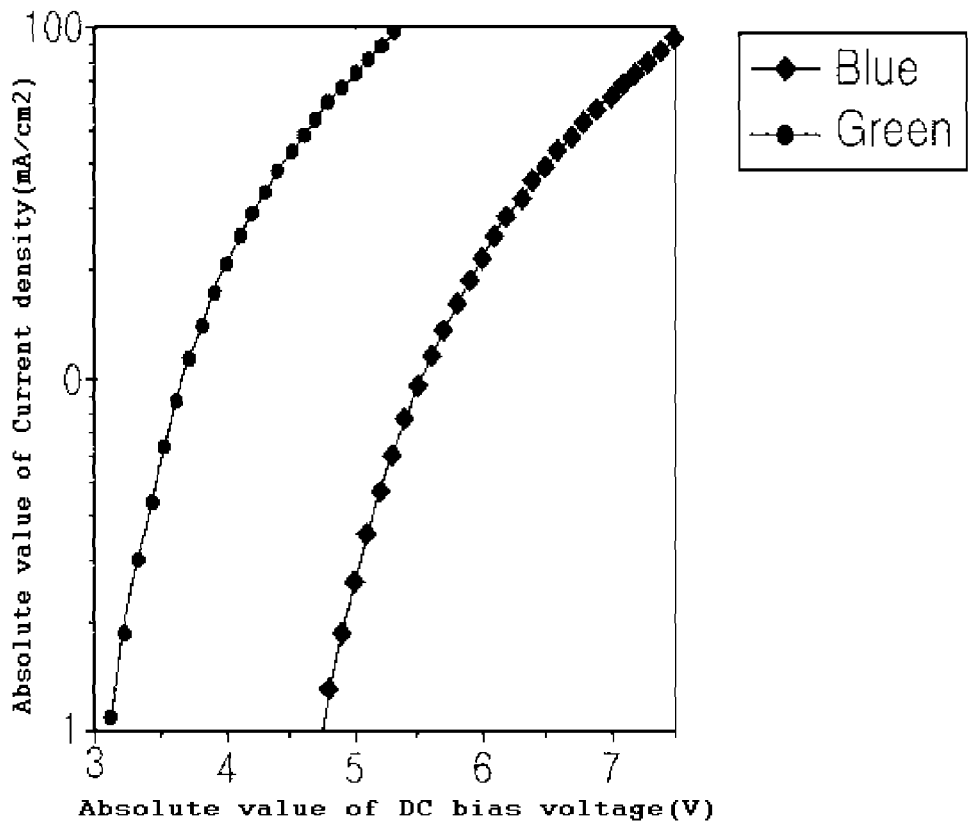
FIG. 22 is the data of current-voltage characteristics of the blue and green light emission at forward and reverse voltages in the stacked organic light emitting device according to Example 1 as one embodiment of the present invention.
Figure 23:
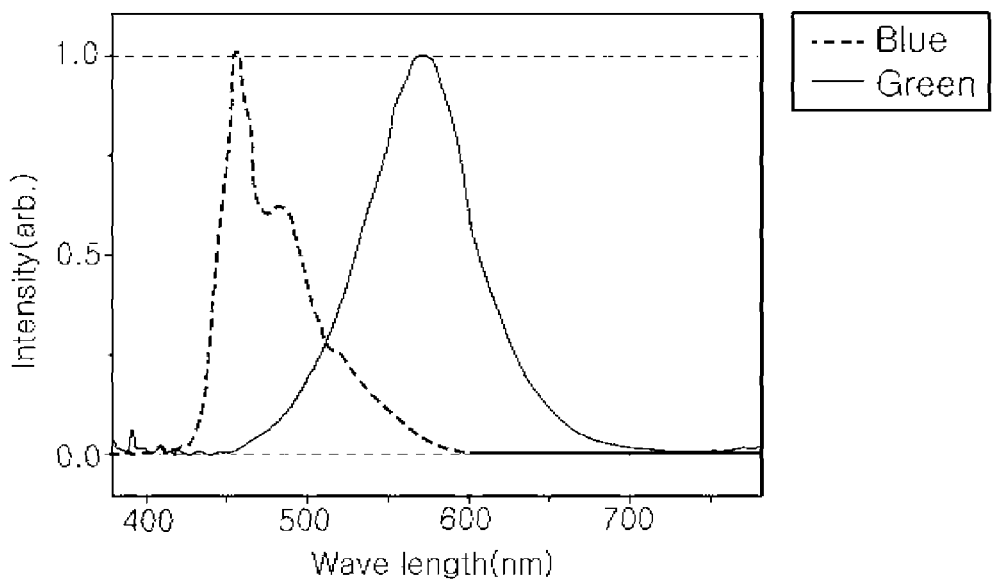
FIG. 23 is the blue and green light emission spectrum at forward and reverse voltages in the stacked organic light emitting device according to Example 1 as one embodiment of the present invention.
Figure 24:
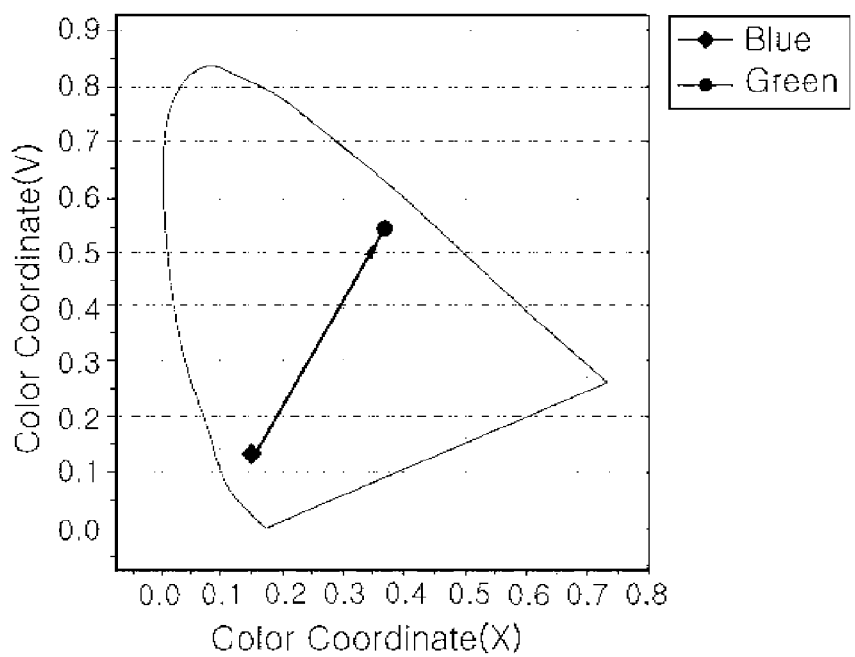
FIG. 24 is the light emission color coordinate at forward and reverse voltages in the stacked organic light emitting device according to Example 1 as one embodiment of the present invention.
Figure 25:
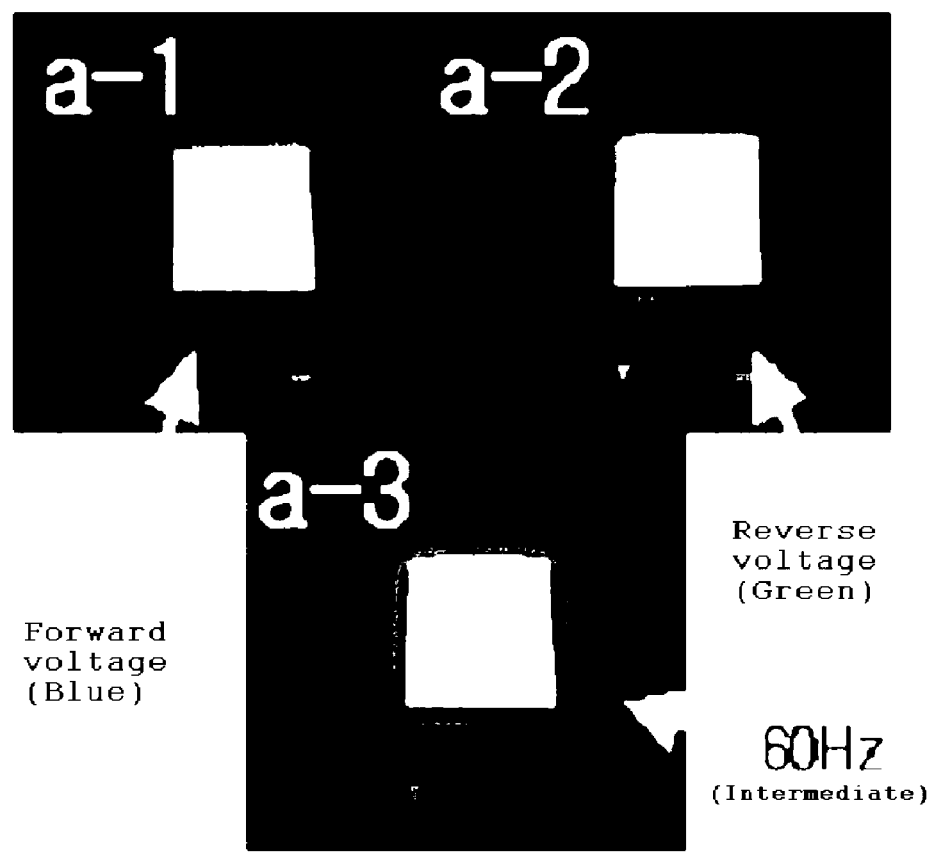
FIG. 25 is the light emission photograph upon forwardly and reversely driving at 60 Hz using a forward, reverse and pulse generators in the stacked organic light emitting device according to Example 1 as one embodiment of the present invention.

In the stacked device according to Example 1 for blue and green light emission, blue light emission was observed with the color coordinate, x=0.136 and y=0.167 at a forward voltage of 7 V, and green light emission was observed with x=0.371 and y=0.576 at a reverse voltage 5 V (see FIG. 22). Table 1 shows luminances and color coordinates of the blue and green lights according to the forward and reverse voltages. FIG. 23 illustrates the light emission spectrum. Further, when reverse and forward voltages are applied using a pulse generator at 60 Hz, light in mixed color of blue and green colors was observed, and as shown in FIG. 24 and FIG. 25, the color of the emitted light varied in blue to green depending on the width of the pulse or the pulse voltage.

These results confirm that the light emission device for emitting two-color light according to the forward voltage and the reverse voltage can be obtained by preparing a device of a double stacked structure according to the present invention, and that a device having variance in the colors of the emitted light can be obtained by varying the width of the pulse or the intensity of the forward voltage and the reverse voltage.

TABLE 1

Luminances and color coordinates of the blue and green lights according to the forward and reverse voltages

| Current density (mA/cm$^2$) | Forward voltage (Blue light emission) | | | Reverse voltage (Green light emission) | | |
|---|---|---|---|---|---|---|
| | Voltage (V) | Luminance (cd/m$^2$) | Color coordinate (x, y) | Voltage (V) | Luminance (cd/m$^2$) | Color Coordinate (x, y) |
| 10 | 5.3 | 375 | 0.136, 0.167 | 3.7 | 333 | 0.371, 0.576 |
| 50 | 6.3 | 1772 | 0.136, 0.167 | 4.4 | 1731 | 0.371, 0.576 |
| 100 | 7.0 | 3496 | 0.136, 0.167 | 4.9 | 3547 | 0.371, 0.576 |

The invention claimed is:

1. A stacked organic light emitting device, comprising a first conductive layer, at least one intermediate conductive layer and a second conductive layer, and light emitting units disposed between the conductive layers, wherein at least two non-neighboring conductive layers among the conductive layers are conductive layers belonging to Group 1 such that they are electrically connected with each other to a common potential; one of the conductive layers which is not electrically connected with the conductive layers belonging to Group 1 to a common potential is a conductive layer belonging to Group 2, or two or more non-neighboring conductive layers of the conductive layers which are not electrically connected with the conductive layers belonging to Group 1 to a common potential are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage by a sine wave alternating current voltage, a direct current voltage or a pulse voltage, wherein the voltage regulator is provided with a means of modulating the width or height of the sine wave or the pulse, and at least one intermediate conductive layer is formed of Ca.

2. The stacked organic light emitting device according to claim 1, wherein the first conductive layer and at least one intermediate conductive layer are conductive layers belonging to Group 1 such that they are electrically connected with each other to a common potential; the second conductive layer, and at least one intermediate conductive layer not belonging to Group 1 are conductive layers belonging to Group 2 such that they are electrically connected with each other to a common potential; the conductive layers belonging to Group 1 are not neighboring to each other, the conductive layers belonging to Group 2 are not neighboring to each other, and the conductive layers belonging to Group 1 and the conductive layers belonging to Group 2 are connected with each other via a voltage regulator for alternately applying a positive voltage and a negative voltage.

3. The stacked organic light emitting device according to claim 1, wherein the first conductive layer and the second conductive layer are conductive layers belonging to Group 1 such that they are electrically connected with each other to a common potential; one of the intermediate conductive layers is a conductive layer belonging to Group 2, or two or more non-neighboring conductive layers of the intermediate conductive layers are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

4. The stacked organic light emitting device according to claim 1, wherein the first conductive layer, the second conductive layer, and at least one intermediate conductive layer which is not adjacent to the first and second conductive layers are conductive layers belonging to Group 1 such that they are electrically connected with each other to a common potential; one of the conductive layers which is not electrically connected with the conductive layers belonging to Group 1 to a common potential is a conductive layer belonging to Group 2, or two or more non-neighboring conductive layers of the conductive layers which are not electrically connected with the conductive layers belonging to Group 1 to a common potential are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

5. The stacked organic light emitting device according to claim 1, comprising a first conductive layer, a first light emitting unit, an intermediate conductive layer, a second first light emitting unit, and a second conductive layer, wherein the first conductive layer and the second conductive layer are conductive layers belonging to Group 1 such that they are electrically connected with each other to a common potential; and the intermediate conductive layer and the conductive layers belonging to Group 1 are connected with each other via a voltage regulator for alternately applying a positive voltage and a negative voltage.

6. The stacked organic light emitting device according to claim 1, comprising a first conductive layer, a first light emitting unit, a first intermediate conductive layer, a second light emitting unit, a second intermediate conductive layer, a third light emitting unit and a second conductive layer, wherein the first conductive layer and the second intermediate conductive layer are conductive layers belonging to Group 1 such that they are electrically connected with each other to a common potential; the first intermediate conductive layer and the second conductive layer are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

7. The stacked organic light emitting device according to claim 1, comprising a first conductive layer, a first light emitting unit, a first intermediate conductive layer, a second light emitting unit, a second intermediate conductive layer, a third light emitting unit and a second conductive layer, wherein the first conductive layer and the second conductive layer are conductive layers belonging to Group 1 such that they are electrically connected with each other to a common potential; and any one of the first intermediate conductive layer and the second intermediate conductive layer, and the conductive layers belonging to Group 1 are connected with each other via a voltage regulator for alternately applying a positive voltage and a negative voltage.

8. The stacked organic light emitting device according to claim 1, comprising a first conductive layer, a first light emitting unit, a first intermediate conductive layer, a second light emitting unit, a second intermediate conductive layer, a third light emitting unit, a third intermediate conductive layer, a fourth light emitting unit and a second conductive layer, wherein the first conductive layer and the second intermediate conductive layer are conductive layers belonging to Group 1 such that they are electrically connected with each other to a common potential; the second conductive layer and the first intermediate conductive layer are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

9. The stacked organic light emitting device according to claim 1, comprising a first conductive layer, a first light emitting unit, a first intermediate conductive layer, a second light emitting unit, a second intermediate conductive layer, a third light emitting unit, a third intermediate conductive layer, a fourth light emitting unit and a second conductive layer, wherein the first conductive layer and second conductive layer are conductive layers belonging to Group 1 such that they are electrically connected with each other to a common potential; and at least one of the first intermediate conductive layer, the second intermediate conductive layer and the third intermediate conductive layer, and the conductive layers belonging to Group 1 are connected with each other via a voltage regulator for alternately applying a positive voltage and a negative voltage.

10. The stacked organic light emitting device according to claim 1, comprising a first conductive layer, a first light emitting unit, a first intermediate conductive layer, a second light emitting unit, a second intermediate conductive layer, a third light emitting unit, a third intermediate conductive layer, a fourth light emitting unit and a second conductive layer, wherein the first conductive layer, the second intermediate conductive layer and the second conductive layer are conductive layers belonging to Group 1 such that they are electrically connected with each other to a common potential; the first intermediate conductive layer and the third intermediate conductive layer are conductive layers belonging to Group 2 such that they are electrically connected with each other to a common potential; and the conductive layers belonging to Group 1 and the conductive layers belonging to Group 2 are connected with each other via a voltage regulator for alternately applying a positive voltage and a negative voltage.

11. The stacked organic light emitting device according to claim 1, wherein it is a bottom emission device, a top emission device, or a top-and-bottom emission device.

12. The stacked organic light emitting device according to claim 1, wherein the first conductive layer is an anode electrode, and the second conductive layer is a cathode electrode.

13. The stacked organic light emitting device according to claim 1, wherein the first conductive layer is a cathode electrode, and the second conductive layer is an anode electrode.

14. The stacked organic light emitting device according to claim 1, wherein the light emitting units each independently comprises at least one layer selected from a light emitting layer, a hole injecting layer, a hole transporting layer, an electron transporting layer, and an electron injecting layer.

15. The stacked organic light emitting device according to claim 1, wherein the light emitting units comprise light emitting layers formed of different materials.

16. The stacked organic light emitting device according to claim 1, wherein the light emitting units have a forward structure comprising a hole injecting layer, a hole transporting layer, a light emitting layer and an electron transporting layer, which are stacked in this order.

17. The stacked organic light emitting device according to claim 1, wherein the light emitting units have a reverse structure comprising an electron transporting layer, a light emitting layer, a hole transporting layer, and a hole injecting layer, which are stacked in this order.

18. The stacked organic light emitting device according to claim 1, wherein the light emitting units have both of a forward structure comprising a hole injecting layer, a hole transporting layer, a light emitting layer and an electron transporting layer, which are stacked in this order, and a reverse structure comprising an electron transporting layer, a light emitting layer, a hole transporting layer and a hole injecting layer, which are stacked in this order.

19. The stacked organic light emitting device according to claim 1, wherein at least one of the light emitting units comprises an n-type organic material layer adjacent to any one of the conductive layers, and a p-type organic material layer to form an NP junction with the n-type organic material layer, and their energy levels satisfy the following equations:

$$E_{nL} - E_F \leq 4 \text{ eV} \tag{1}$$

$$E_{pH} - E_{nL} \leq 1 \text{ eV} \tag{2}$$

(in the above equations (1) and (2), $E_F$ is a Fermi energy level of the conductive layer adjacent to the n-type organic material layer, $E_{nF}$ is a LUMO (lowest unoccupied molecular orbital) energy level of the n-type organic material layer, and $E_{pH}$ is HOMO (highest occupied molecular orbital) energy level of the p-type organic material layer).

20. The stacked organic light emitting device according to claim 19, wherein the (m+1)th light emitting unit from the first conductive layer comprises an n-type organic material layer adjacent to the (m)th intermediate conductive layer from the first conductive layer, wherein n is an integer of 1 or more, and a p-type organic material layer to form an NP junction with the n-type organic material layer, and their energy levels satisfy the above-described equations (1) and (2).

21. The stacked organic light emitting device according to claim 19, wherein the light emitting unit adjacent to the first conductive layer comprises an n-type organic material layer adjacent to the first conductive layer, and a p-type organic material layer to form an NP junction with the n-type organic material layer, and their energy levels satisfy the above-described equations (1) and (2).

22. The stacked organic light emitting device according to claim 19, wherein the (m)th light emitting unit from the first conductive layer comprises an n-type organic material layer adjacent to the (m)th intermediate conductive layer from the first conductive layer, wherein n is an integer of 1 or more, and a p-type organic material layer to form an NP junction with the n-type organic material layer, and their energy levels satisfy the above-described equations (1) and (2).

23. The stacked organic light emitting device according to claim 19, wherein the light emitting unit adjacent to the second conductive layer comprises an n-type organic material layer adjacent to the second conductive layer, and a p-type organic material layer to form an NP junction with the n-type organic material layer, and their energy levels satisfy the above-described equations (1) and (2).

24. The stacked organic light emitting device according to claim 19, wherein the n-type organic material layer is a hole injecting layer in the each light emitting unit.

25. The stacked organic light emitting device according to claim 19, wherein the n-type organic material layer comprises a compound of the following formula 1:

[Formula 1]

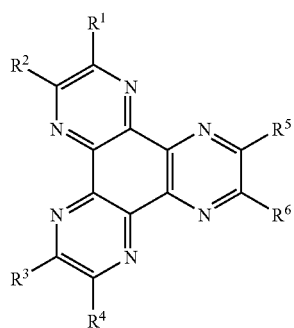

wherein $R^1$ to $R^6$ are each independently selected from the group consisting of hydrogen, a halogen atom, nitrile (—CN), nitro (—NO$_2$), sulfonyl (—SO$_2$R$^{11}$), sulfoxide (—SOR$^{11}$), sulfonamide (—SO$_2$NR$^{11}$R$^{12}$), sulfonate (—SO$_3$R$^{11}$), trifluoromethyl (—CF$_3$), ester (—COOR$^{11}$), amide (—CONHR$^{11}$ or —CONR$^{11}$R$^{12}$), substituted or unsubstituted linear or branched C$_1$-C$_{12}$ alkoxy, substituted or unsubstituted linear or branched C$_1$-C$_{12}$ alkyl, substituted or unsubstituted aromatic or non-aromatic heterocycle, substituted or unsubstituted aryl, substituted or unsubstituted mono-arylamine or di-arylamine, and substituted or unsubstituted aralkylamine, and R$^{11}$ and R$^{12}$ are selected from the group consisting of substituted or unsubstituted C$_1$-C$_{60}$ alkyl, substituted or unsubstituted aryl, and substituted or unsubstituted 5- to 7-membered heterocycle.

26. The stacked organic light emitting device according to claim 25, wherein the compound of the formula 1 is selected from the compounds represented by the following formulae 1-1 to 1-6:

[Formula 1-1]

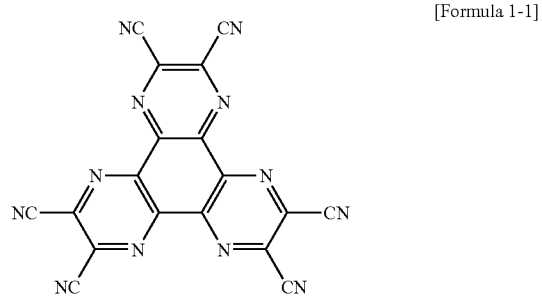

[Formula 1-2]

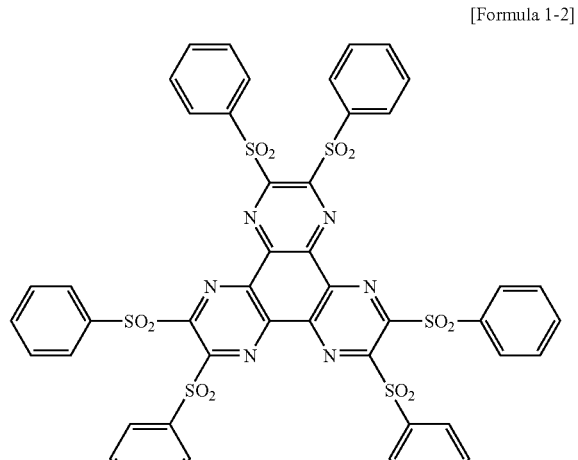

[Formula 1-3]

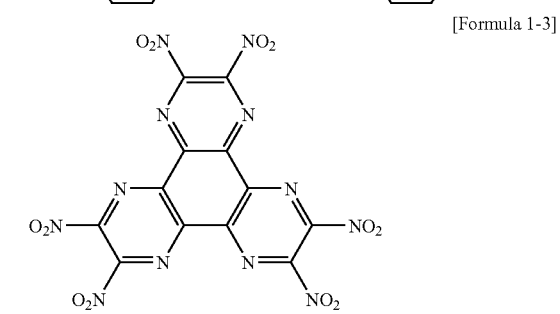

-continued

[Formula 1-4]

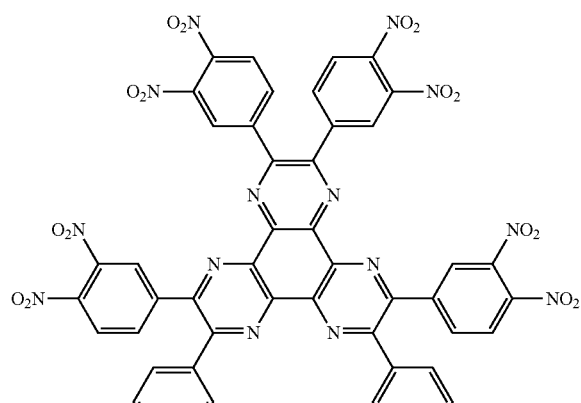

[Formula 1-5]

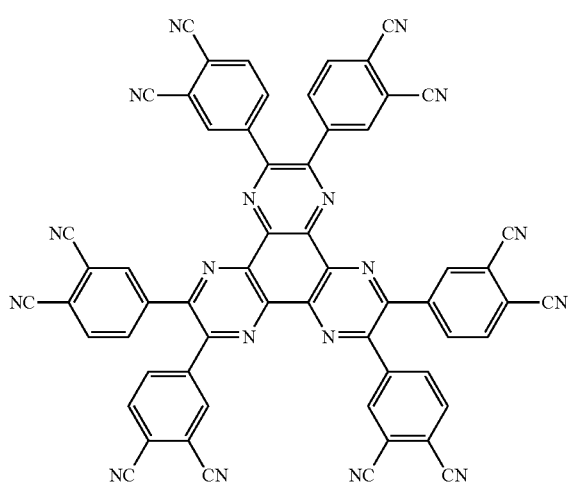

[Formula 1-6]

27. The stacked organic light emitting device according to claim 19, wherein the n-type organic material layer comprises a compound selected from 2,3,5,6-tetrafluoro-7,7,8,8-tetracyanoquinodimethane (F4TCNQ), fluorine-substituted 3,4,9, 10-perylenetetracarboxylic dianhydride (PTCDA), cyano-substituted 3,4,9,10-perylenetetracarboxylic dianhydride (PTCDA), naphthalenetetracarboxylicdianhydride (NTCDA), fluorine-substituted naphthalenetetracarboxylicdianhydride (NTCDA), and cyano-substituted naphthalenetetracarboxylicdianhydride (NTCDA).

28. The stacked organic light emitting device according to claim 19, wherein at least one of the light emitting units comprises an organic material layer containing the compound with a functional group selected from an imidazole group, an oxazole group and a thiazole group.

29. The stacked organic light emitting device according to claim 28, wherein the organic material layer comprising the compound containing a functional group selected from an imidazole group, an oxazole group and a thiazole group include the compounds represented by the following formula 2 or 3:

[Formula 2]

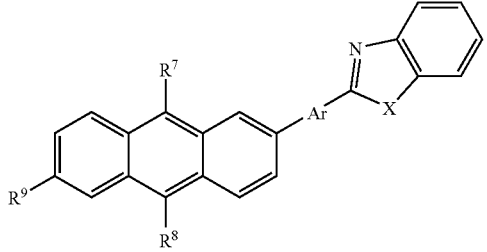

wherein $R^7$ and $R^8$ may be the same as or different from each other, and are each independently hydrogen, a $C_1$-$C_{20}$ aliphatic hydrocarbon, or an aromatic ring or aromatic heterocycle; Ar is an aromatic ring or aromatic heterocycle; $R^9$ is hydrogen, a $C_1$-$C_6$ aliphatic hydrocarbon, or an aromatic ring or aromatic heterocycle; X is O, S or $NR^{13}$; $R^{13}$ is hydrogen, a $C_1$-$C_7$ aliphatic hydrocarbon, or an aromatic ring or aromatic heterocycle, provided that $R^7$ and $R^8$ are not hydrogen at the same time;

[Formula 3]

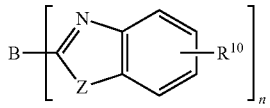

wherein Z is O, S or $NR^{14}$; $R^{10}$ and $R^{14}$ may be the same as or different from each other, and are each independently hydrogen, a $C_1$-$C_{24}$ alkyl, a $C_5$-$C_{20}$ aryl or heteroatom-containing substituted aryl, halogen or alkylene capable of forming a fused ring with a benzazole ring, or a heteroatom-containing alkylene; B, as a linking unit, is alkylene, arylene, substituted alkylene, or substituted arylene to link the multiple benzazoles to be conjugated or non-conjugated; and n is an integer of 3 to 8.

30. The stacked organic light emitting device according to claim 28, wherein the light emitting units containing an organic material layer comprising the compound containing a functional group selected from an imidazole group, an oxazole group and a thiazole group includes an n-type organic material layer adjacent to the conductive layer, and a p-type organic material layer to form an NP junction with the n-type organic material layer.

31. The stacked organic light emitting device according to claim 1, wherein at least one of the light emitting units comprises an organic material layer containing the compound with a functional group selected from an imidazole group, an oxazole group and a thiazole group.

32. The stacked organic light emitting device according to claim 31, wherein the organic material layer comprising the compound containing a functional group selected from an imidazole group, an oxazole group and a thiazole group include the compounds represented by the following formula 2 or 3:

[Formula 2]

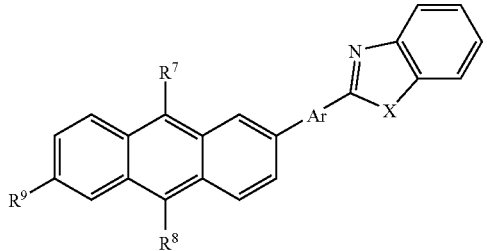

wherein $R^7$ and $R^8$ may be the same as or different from each other, and are each independently hydrogen, a $C_1$-$C_{20}$ aliphatic hydrocarbon, or an aromatic ring or aromatic heterocycle; Ar is an aromatic ring or aromatic heterocycle; $R^9$ is hydrogen, a $C_1$-$C_6$ aliphatic hydrocarbon, or an aromatic ring or aromatic heterocycle; X is O, S or $NR^{13}$; $R^{13}$ is hydrogen, a $C_1$-$C_7$ aliphatic hydrocarbon, or an aromatic ring or aromatic heterocycle, provided that $R^7$ and $R^8$ are not hydrogen at the same time;

[Formula 3]

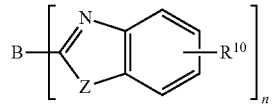

wherein Z is O, S or $NR^{14}$; $R^{10}$ and $R^{14}$ may be the same as or different from each other, and are each independently hydrogen, a $C_1$-$C_{24}$ alkyl, a $C_5$-$C_{20}$ aryl or heteroatom-containing substituted aryl, halogen or alkylene capable of forming a fused ring with a benzazole ring, or a heteroatom-containing alkylene; B, as a linking unit, is alkylene, arylene, substituted alkylene, or substituted arylene to link the multiple benzazoles to be conjugated or non-conjugated; and n is an integer of 3 to 8.

* * * * *